United States Patent
Wheland et al.

(10) Patent No.: US 6,872,503 B2
(45) Date of Patent: Mar. 29, 2005

(54) COPOLYMERS FOR PHOTORESISTS AND PROCESSES THEREFOR

(75) Inventors: Robert Clayton Wheland, Wilmington, DE (US); Roger Harquail French, Wilmington, DE (US); Frank Leonard Schadt, III, Wilmington, DE (US); Frederick C. Zumsteg, Jr., Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/257,901

(22) PCT Filed: May 4, 2001

(86) PCT No.: PCT/US01/14532
§ 371 (c)(1),
(2), (4) Date: Oct. 16, 2002

(87) PCT Pub. No.: WO01/85811
PCT Pub. Date: Nov. 15, 2001

(65) Prior Publication Data
US 2003/0215735 A1 Nov. 20, 2003

Related U.S. Application Data
(60) Provisional application No. 60/202,143, filed on May 5, 2000.

(51) Int. Cl.$^7$ .............................................. G03C 1/492
(52) U.S. Cl. .................... 430/270.1; 430/325; 430/326; 430/331; 526/253; 526/254
(58) Field of Search ................................. 526/253, 254; 430/270.1, 325, 326, 331

(56) References Cited
U.S. PATENT DOCUMENTS 2,409,274 A 10/1946 Hanford et al.
5,880,234 A 3/1999 Maeda et al.
6,593,058 B1 * 7/2003 Feiring et al. ............. 430/270.1

FOREIGN PATENT DOCUMENTS

EP   0 150 725      8/1985
WO   WO00/25178    5/2000

OTHER PUBLICATIONS

Introduction to Microlithography, Second Edition by L.F. Thompson, C.G. Willson, and M. J. Bowden, American Chemical Society, Washington, DC 1994.

B. A. Lombos, P. Sauvageau, and C. Sandorfy, Chem. Phys. Lett, 1967, 42.

K. Seki, H. Tanaka, T. Ohta, Y. Aoki, A. Imamura, H. Fujimoto, H. Yamamoto, H. Inokuchi, Phys. Scripta, 41, 167 (1990).

Bloomstein et al. (J. Vacuum Sci. Technol., B16, 3154 (1998).

* cited by examiner

Primary Examiner—Bernard Lipman

(57) ABSTRACT

Fluoroolefin/acid group or protected acid group-containing copolymers for photoresist compositions and microlithography methods employing the photoresist compositions are described. These copolymer compositions comprise 1) at least one fluoroolefin, preferably hexafluoroisobutylene, and 2) an acid group or a protected acid group (e.g., a t-alkyl ester, preferably a t-butyl ester), which together impart high ultraviolet (UV) transparency and developability in basic media to these materials. The materials of this invention have high UV transparency, particularly at short wavelengths, e.g., 157 nm and 193 nm, which makes them useful for lithography at these short wavelengths.

14 Claims, 10 Drawing Sheets

COPOLYMERS FOR PHOTORESISTS AND PROCESSES THEREFOR

CROSS-REFERENCE TO RELATED APPLICATIONS

This application claims the benefit of prior filed now abandoned provisional application No. 60/202,143 filed on May 5, 2000 which is incorporated herein by reference in its entirety.

BACKGROUND OF THE INVENTION

1. Field of the Invention

The present invention pertains to a copolymer containing a first repeat unit derived from a fluoroolefin and a second repeat unit derived from an ethylenically unsaturated monomer containing an acid group or a protected acid group which cocopolymer is useful in a photoresist composition for imaging in the production of semiconductor devices.

2. Background

In the process for manufacturing semiconductor devices, very fine features are etched onto a substrate, typically a silicon wafer. The features are formed on the substrate by electromagnetic radiation which is impinged, imagewise, on a photoresist composition applied to the silicon wafer. Areas of the photoresist composition which are exposed to the electromagnetic radiation change chemically and/or physically to form a latent image which can be processed into an image for semiconductor device fabrication. Positive working photoresist compositions generally are utilized for semiconductor device manufacture.

The photoresist composition typically is applied to the silicon wafer by spin coating. The silicon wafer may have various different material layers applied to it in other processing steps. In addition, in a particular photolithographic processing step, the silicon wafer may have a hard mask layer, typically of silicon dioxide or silicon nitride, applied below the photoresist composition layer. In addition, an antireflective layer (ARC) may be applied below the photoresist composition layer, by a coating process (and is then typically referred to as a bottom anti-reflective (BARC)) or on top of the photoresist composition layer (and typically called a top-anti reflective layer (TARC)). Typically the thickness of the resist layer is sufficient to resist the dry chemical etch processes used in transferring a pattern to the silicon wafer.

Various copolymer products for photoresist compositions have been described in *Introduction to Microlithography Second Edition* by L. F. Thompson, C. G. Willson, and M. J. Bowden, American Chemical Society, Washington, DC, 1994.

The photoresist composition generally comprises a film forming copolymer which may be photoactive and a photosensitive composition that contains one or more photoactive components. As described in the Thompson et al. publication, upon exposure to electromagnetic radiation (e.g., UV light), the photoactive component acts to change the rheological state, solubility, surface characteristics, refractive index, color, electromagnetic characteristics or other such physical or chemical characteristics of the photoresist composition.

The use of ultraviolet light of lower wavelength corresponds to higher resolution (lower resolution limit). Lithography in the UV at 365 nm (I-line) is a currently established image-forming process for making semiconductor devices. The features formed by this process have a resolution limit of about 0.35–0.30 micron. Known photoresist compositions for lithography using a 365 nm wavelength are made from novolak copolymers and diazonaphthoquinones as dissolution inhibitors. Lithography in the deep UV at 248 nm has been found to have a resolution limit of approximately 0.35–0.13 micron. The known photoresist compositions for this process are made from p-hydroxystyrene copolymers. Lithographic processes using electromagnetic radiation at even shorter wavelengths are looked to for forming very fine features because the use of lower wavelengths correspond to higher resolution; that is, in deep (wavelength less than 300 nm), vacuum (wavelength less than 200 nm) or even the extreme (wavelength less than 30 nm) ultraviolet. However, at wavelengths of 193 nm or shorter, the photoresist compositions known for use at 365 nm and 248 nm have been found to lack sufficient transparency.

A key difficulty encountered in developing copolymers for use in photoresist compositions that are imaged at lower wavelengths, e.g., 157 nm, is the lack of transparency at these low wavelengths. The transparency requirements for photoresist compositions are usually on the order of allowing about 20 to about 40% of incident light to penetrate the full thickness of the resist layer to produce an image with well-defined, vertical side walls, which are important in achieving high resolution and minimizing defects. Copolymers which lack transparency absorb too much light and thereby produce an unacceptable image with low resolution and too many defects.

A thick film layer of the photoresist material is beneficial for high resolution and low defects. However, thick films tend to lack transparency at low wavelengths. To determine the absorbance requirements of a copolymeric material that will allow about 20 to about 40% of incident light to penetrate the resist film layer, the light transmission (T) for a thin copolymeric resist film layer, considering the effects of optical interference in the film, was calculated as a function of the film thickness in angstroms (t) and the optical absorbance per micron (of film thickness) of a film layer containing the copolymer. The results are shown for a copolymeric resist for use at 157 nm in FIG. 1 and for a copolymeric resist for use at 193 nm in FIG. 2. In this calculation an index of refraction (n) for the resist of 1.6 is used and no effect(s) of the underlying silicon substrate, representing the light transmitted through an unsupported copolymer film layer have been considered to represent the light transmitted through an unsupported film. As shown in FIG. 1, that for films of approximately 1300 angstroms thickness to achieve a transmitted light intensity at 157 nm of about 20% can require a copolymer film with an absorbance per micron (of film thickness) at 157 nm below 5 per micron (<5 $\mu m^{-1}$). For use at 193 nm, as shown in FIG. 2, that for films of approximately 5500 angstroms thickness, to achieve a transmitted light intensity at 193 nm of about 25% can require a copolymer film with an absorbance per micron (of film thickness) at 193 nm below 1 per micron (less than 1 $\mu m^{-1}$), while for a film thickness of 4000 angstroms, a copolymer film having an absorbance per micron of 2 per micron ($2 \mu m^{-1}$) can have a transmitted light intensity at 193 nm of only about 14%. Accordingly, the thicker a film gets, the lower absorption it must have to transmit a reasonable percentage of incident short wavelenght light.

The molecular weight of a polymer for a photoresist composition which is sufficient for high film-forming properties may be detrimental to transparency at low wavelengths. Table 1 below shows the known absorption maxima for simple hydrocarbon $H(CH_2)_nH$ and fluorocarbon $F(CF_2)_n F$ chains. As these chains become longer, their absorption moves to longer wavelengths, first starting up at 157 nm for hydrocarbons when n is greater than 1 and for fluorocarbons when n is greater than about 10. This implies that polymers having $(CH_2)_n$ chain segments with n greater than 1 and $(CF_2)_n$ segments with n greater than about 10 are likely to be highly absorbing at 157 nm. One of the problems faced therefore by one wanting to make resists highly transparent to 157 nm light is how to achieve polymeric molecular weights, especially molecular weights sufficient for film-forming capability, while avoiding long $(CH_2)_n$ and $(CF_2)_n$ chains which hinder tranparency.

TABLE 1

Comparison of UV Absorption Maxima for
Hydrocarbons and Fluorocarbons

| | WAVELENGTH OF ABSORPTION MAXIMUM | |
|---|---|---|
| $X(CX_2)_nX$ | X = H[1] | X = F |
| n = 1 | 143 nm & 128 nm | |
| n = 2 | 158 nm & 132 nm | |
| n = 3 | 159 nm & 140 nm | 119 nm[1] |
| n = 4 | 160 nm & 141 nm | 126 nm[1] |
| n = 5 | 161 nm & 142 nm | 135 nm[1] |
| n = 6 | 162 nm & 143 nm | 142 nm[1] |
| n = 7 | 163 nm & 143 nm | |
| n = 8 | 163 nm & 142 nm | |
| N = 172 | | 161 nm[2] |

[1]B. A. Lombos, P. Sauvageau, and C. Sandorfy, Chem, Phys. Lett., 1967, 42.
[2]2. K. Seki, H. Tanaka, T. Ohta, Y. Aoki, A, Imamura, H. Fujimoto, H. Yamamoto, H. Inokuchi, Phys. Scripta, 41, 167(1990).

Even when a copolymer film for use in imaging at 157 nm is only 1500 Å thick, very few organic copolymers have been found that allow about 20 to about 40% of 157 nm light to penetrate or, that is, that have an (optical) absorbance per micron (absorbance (A) per micron of film thickness t) of less than $3 \mu m^{-1}$. For example, of 12 candidate copolymer systems tested, Bloomstein et. al. (J. Vacuum Sci. Technol., B16, 3154 (1998)) report only three copolymers having an absorbance per micron less than $3 \mu m^{-1}$. These three copolymers are Teflon™ AF having an absorbance per micron of about $0.5 \mu m^{-1}$, poly(methysiloxane) having an absorbance per micron of about $1.5 \mu m^{-1}$, and poly(phenylsiloxane) having an absorbance per micron of about $2.5 \mu m^{-1}$. Attempts to convert these pure copolymers into thin films both sensitive to light and capable of aqueous base development have tended to increase absorption at 157 nm. Indeed, none of the three transparent copolymer systems found by Bloomstein have yet been successfully converted into practical resists. There is a need for photosensitive, aqueous base developable copolymers sufficiently transparent to UV light to make a good resist. Resists effective at 157 nm should also work at longer wavelengths (for example, 193 and 248 nm).

Because photolithography at the shorter wavelengths would provide the very fine features having lower resolution limits; that is, a resolution limit of approximately 0.18–0.12 micron at 193 nm, approximately 0.07 micron at 157 nm photoresist compositions that will be sufficiently transparent at these short wavelenths are needed.

There is a need for suitable photoresist compositions for use at 193 nm and lower, particularly at 157 nm, that have not only high transparency at these short wavelengths but also other key properties, including good plasma etch resistance, development characteristics, and adhesive properties.

(copolymer of Example 9) and two formulated photoresists (9A and 9B of Example 9) of P(HFIB:VF2:tBMA) versus wavelength lambda (λ) in units of nanometers.

Figure 11:
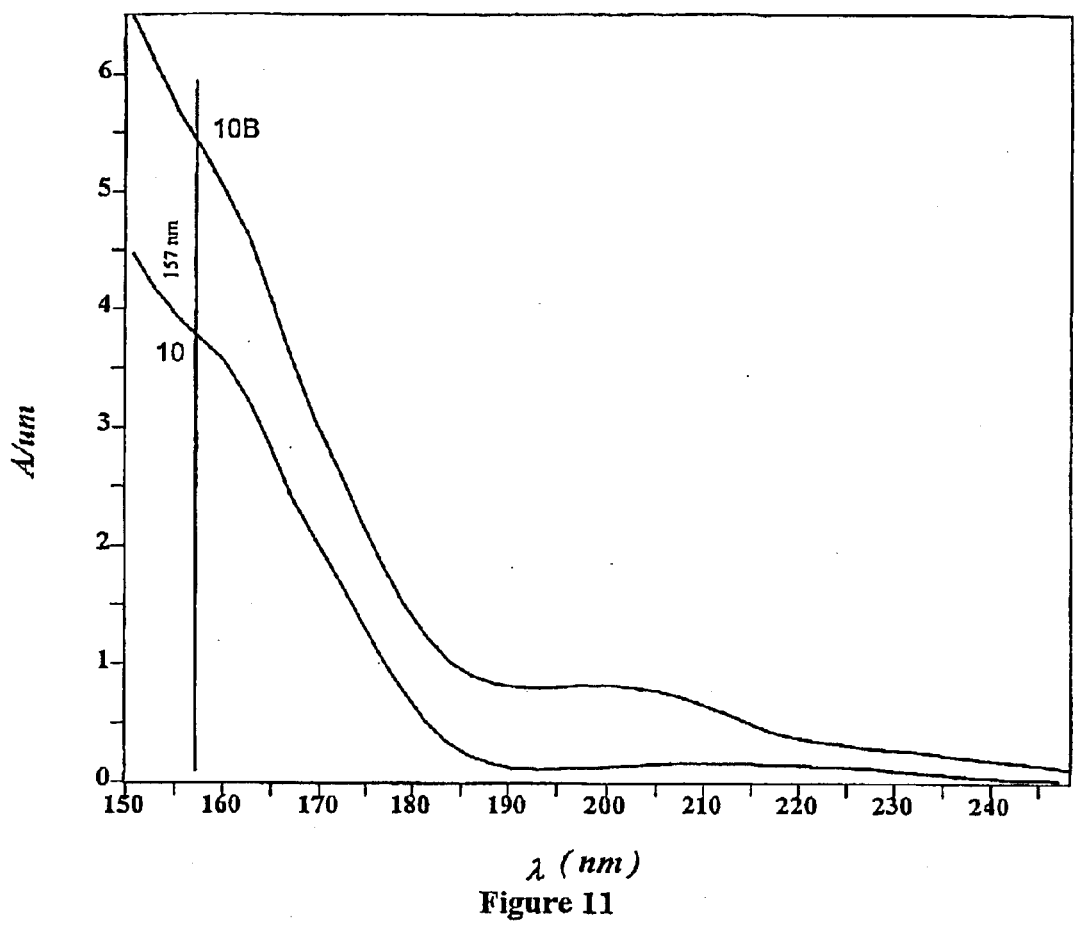

FIG. 11 is a plot of the optical absorbance per micron in units of inverse microns for P(HFIB/tBA) (copolymer of Example 10) and a formulated photoresist (10B of Example 10) of P(HFIB/tBMA) versus wavelength lambda (λ) in units of nanometers.

SUMMARY OF THE INVENTION

In one embodiment, the invention is a copolymer comprising:

(a) a first repeat unit derived from at least one fluoroolefin having the structure:

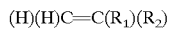

wherein $R_1$ and $R_2$ are independently selected from the group consisting of $C_1$–$C_3$ perfluoroalkyl, or taken together are $(CF_2)_n$ wherein n is 3 to 5; and (b) a second repeat unit derived from a first ethylenically unsaturated comonomer comprising an acid group or a protected acid group.

In another embodiment, the invention is directed to a photoresist comprising the copolymer and at least one photoactive component.

In yet another embodiment, the invention is directed to a process for preparing a photoresist image on a substrate comprising (A) applying the photoresist composition of this invention to a substrate to form a photoresist layer, (B) imagewise exposing the photoresist layer to form imaged and non-imaged areas; and (C) developing the exposed photoresist layer having imaged and non-imaged areas to form the photoresist image on the substrate.

With respect to some specific embodiments of the photoresists, the copolymer comprising a first repeat unit derived from a fluoroolefin and a second repeat unit derived from (meth)acrylate ester-containing copolymer present as a component in a photoresist preferably has an optical absorbance per micron of less than 5.0 $\mu m^{-1}$ at a wavelength of 157 nm. In other certain embodiments, the copolymer comprising a first repeat unit derived from a fluoroolefin and a second repeat unit derived from (meth)acrylate ester-containing copolymer can be further comprised of an aliphatic polycyclic functionality. In some embodiment(s), the photoactive component can be a photoacid generator. In still other embodiment(s), the photoresists can be further comprised of a dissolution inhibitor.

DETAILED DESCRIPTION OF THE INVENTION

A key characteristic of the copolymers (and photoresists comprised of the copolymers) of this invention is the cooperative combination in the copolymer of the first repeat unit with the second repeat unit. Another characteristic of the copolymer is that it does not detrimentally absorb in the vacuum and far UV. The minimization of functionality, such as aromatic groups, which absorb in the ultraviolet in the repeat units of the copolymer is desirable in order for the copolymer to possess suitable, preferably high, optical transparency.

The first repeat unit is derived from a fluoroolefin having the structure:

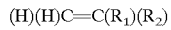

wherein $R_1$ and $R_2$ are independently selected from the group consisting of $C_1$–$C_3$ perfluoroalkyl, or taken together are $(CF_2)_n$ wherein n is 3 to 5. Suitable examples of specific comonomers include, but are not limited to, hexafluoroisobutylene and decafluoroisohexylene.

The second repeat unit is derived from a first ethylenically unsaturated comonomer comprising an acid group or a protected acid group. Suitable, but non-limiting examples of an acid group or a protected acid group for this invention are described below in the section entitled "Protective Groups for Removal by PAC Catalysis".

There can be a third, optional, repeat unit derived from a second ethylenically unsaturated comonomer. In one embodiment, the second ethylenically unsaturated comonomer has the structure CXY=CWZ where X and Y and W can be a fluorine atom or a hydrogen atom and Z can be a fluorine atom, a hydrogen atom, a chlorine atom (when X, Y and W are fluorine), —OH (when W is H), or —O(C=O)R where R=$C_pA_{2p+1}$ in which A is any combination of hydrogen and fluorine atoms +− which the number of fluorine atoms exceeds the number of hydrogen atoms and p is an integer ranging from 1 to 3.

Suitable, non-limiting examples of second ethylenically unsaturated comonomers are vinyl fluoride, vinylidene fluoride, vinyl acetate, trifluoroethylene, chlorotrifluoroethylene, tetrafluoroethylene, 4,5-difluoro-2,2-bis(trifluoromethyl)-1,3-dioxole (perfluorodimethyldioxole), 2,2-bis(trifluoromethyl)-1,3-dioxole(dihydroperfluoromethyldioxole), vinyl alcohol (i.e., a vinyl acetate unit hydrolyzed after copolymerization), 1,3-dioxole-2-one (vinylene carbonate), and maleic anhydride.

The copolymers of this invention preferably are characterized by a repeat unit derived from at least one first ethylenically unsaturated comonomer containing an acid group or a protected acid group (e.g., a t-alkyl ester group) that is present in these copolymers from about 25 to about 60 mole percent and a repeat unit derived from at least one or more fluoroolefin(s) that are present in the copolymer from about 40 to about 65 mole percent. The fluoroolefin/t-alkyl ester copolymers more preferably with respect to achieving low optical absorbance per micron are characterized by a repeat unit derived from at least one first ethylenically unsaturated comonomer containing protected t-alkyl ester group that is present in the copolymers at less than or equal to 60 mole percent, and, still more preferably, at less than or equal to 50 mole percent.

As previously noted, it is believed that long hydrocarbon and fluorocarbon chains in a polymer will be likely to absorb light at 157 nm, making it difficult to achieve transparent materials with polymeric molecular weights. Thus, it is believed that alternating short $(CH_2)_n$ and $(CF_2)_m$ segments in the polymer will be likely to provide a relatively transparent polymer. For example, it has been found that monomers such as vinylidene fluoride in which $CF_2$ alternates with $CH_2$ and hexafluoroisobutylene in which $C(CF_3)_2$ alternates with $CH_2$ favor transparency at 157 nm. Although the value of n and m, and the ratio of hydrocarbon to fluorocarbon in the polymer chain can be varied depending upon the other components of the photoresist and the other repeat units of the polymer, as one skilled in the art would be able to determine, in general more than two immediately adjacent CH2 groups (i.e. $(CH_2)_n$ where n is greater than about 2) and more than about 7 to 10 immediately adjacent CF2 groups (i.e. $(CF_2)_m$ where m is greater than about 7, more typically greater than about 10) will be likely to absorb light at 157 nm. The appropriate alternating sequence can be in the monomer from which the polymer is derived. Alternatively, the alternating sequence can be achieved during the polymerization process by techniques known in the art.

It is recognized though that there usually will be a minimal level of protected acid and/or free acid groups present for the copolymer to be soluble and/or dispersible in aqueous basic solutions (e.g., standard 0.262 N TMAH solution) for developability. This minimal level can vary with the structure of the moiety bearing the protected acid group and with the selection of comonomer(s) and their levels in the copolymers as well as with other parameters of the copolymer such as molecular weight. One skilled in the art can determine readily whether a given copolymer is soluble/dispersible or not in aqueous basic solutions. This requirement for a suitable minimal level of protected acid groups and/or free acid groups in the copolymer to impart base solubility/dispersibility to the copolymer is usually balanced against keeping the level as low as feasible in order to maximize transparency of the copolymer in the far or vacuum UV range of the electromagnetic spectrum.

The copolymers of this invention optionally may be further comprised of a repeat unit derived from a compound comprising an aliphatic polycyclic group. Aliphatic polycyclic groups are of interest because they can often beneficially increase plasma etch resistance or raise $T_g$ by stiffening a polymer chain. They can be incorporated in the polymer as part of the chain (as in the case of norbornene copolymers) or as pendant side groups (as in the case of adamantyl acrylate copolymers). A suitable aliphatic polycyclic group can contain from about seven to about eighteen carbon atoms, can contain olefinic unsaturation, and one or more of the ring carbons can be replaced by heteroatoms such as oxygen, nitrogen, and sulfur. Typically, the aliphatic polycyclic group is a fused polycyclic hydrocarbon containing from about seven to about twelve carbon atoms with two to four rings. The aliphatic polycyclic group can be substituted or unsubstituted. If the aliphatic polycyclic group is substituted, the substituent group can contain from one to about four carbon atoms and, optionally, heteroatoms such as oxygen, nitrogen, sulfur, or halogen such as chlorine or fluorine. Particularly desirable functional groups are those such as —OH or —$C(CF_3)_2OCH_2OCH_3$ which aid in wetting, aqueous solubility, and/or photodevelopment while adding relatively little to light absorption.

When the polymers comprise one or more aliphatic polycyclic groups, the percentage of repeat units of the copolymer containing the aliphatic polycyclic group ranges from about 5 to about 60 mole percent; and preferably from about 10 to about 50 mole percent.

The fluoroolefin copolymers of this invention can contain additional functional groups beyond those specifically mentioned herein with the proviso that, preferably, the copolymer is substantially free of aromatic groups and still more preferably aromatic groups are absent in these copolymers. The presence of aromatic groups in these copolymers has been found to detract from their transparency and result in their being too strongly absorbing in the near, deep and vacuum UV regions of the electromagnetic spectrum to be suitable for use in photoresists that are imaged at wavelengths in the UV. For this reason, in one embodiment of the invention, the copolymer is free of aromatic groups.

In many embodiments according to this invention, the copolymer has an optical absorbance per micron of less than $5.0\ \mu m^{-1}$ at a wavelength of 157 nm, preferably less than $4.0\ \mu m^{-1}$ at this wavelength, more preferably, less than $3.5\ \mu m^{-1}$ at this wavelength, and, most preferably, less than $3.0\ \mu m^{-1}$ at this wavelength.

Copolymerization Methods

Copolymerizations can be carried out by any of the common methods known to those skilled in the art including solution, dispersion, or emulsion copolymerizations employing either batch or continuous processes with either an initial single charge, intermittant, or a continuous feed of reactants.

Considering the present small scale of the copolymerizations exemplified herein, the copolymerizations were most conveniently run using a single initial charge of monomers, organic solvent, and initiator to an autoclave.

The contents of the autoclave were then typically agitated under pressure usually about 10 to about 500 psi (about 0.70 to about 35.15 kg/cm²), typically about 20 to about 100 psi (about 1.41 to about 7.03 kg/cm²) for about 1 to about 48 hours, typically about 6 to about 18 hours at about 10 to about 100° C., typically about 20 to about 75° C., the temperature and reaction time being chosen to match the half-life of the initiator and the thermal stability of the protected acid groups in the copolymer. Common free radical intiators can be used and include diacyl peroxides such as DP ($CF_3CF_2CF_2OCF(CF_3)(C=O)OO(C=O)CF$ ($CF_3)OCF_2CF_2CF_3$, HFPO dimer peroxide), percarbonates such as Perkadox(™) 16N [di(4-t-butylcyclohexyl) peroxydicarbonate), and AIBN (2,2'-azobisisobutyronitrile). For example, when DP (HFPO dimer peroxide) is the initiator and t-butyl acrylate is the source of protected acid groups, copolymerizations were frequently run at ambient temperatures (about 20 to about 30° C.) for about 8 to about 16 hours.

Organic fluids that do not significantly interfere with radical copolymerization such as fluorocarbons, chlorofluorocarbons, chlorofluorohydrocarbons, and hydrofluorocarbons are desirable solvents for the copolymerization. By interfere with copolymerization we mean solvents that change molecular weight by chain transfer or that terminate copolymerization by reaction with the growing radical ends. Preferred solvents include Vertrel(™) XF ($CF_3CFHCFHCF_2CF_3$) and Freon(™) 113 ($CF_2ClCCl_2F$).

Photoresists

The photoresists of this invention are comprised of a copolymer (as described supra) and at least one photoactive component (PAC, discussed infra). The photoresists can either be positive-working or negative-working. Positive-working photoresists are preferred. These photoresists can optionally comprise dissolution inhibitors and/or other additional components. Examples of additional components which can be added include, but are not limited to, resolution enhancers, adhesion promoters, residue reducers, coating aids, plasticizers, and $T_g$ (glass transition temperature) modifiers.

A typical photoresist formulation comprises the copolymer, as described herein, comprising the first repeat unit and the second repeat unit, solvent and a photoactive component which are usually combined and mixed together, typically, at ambient temperature. Illustrative, nonlimiting solvents which may be used include cyclohexanone, 2-heptanone, 1,2-bis(1,1,2,2-tetrafluoroethoxy)ethane ($HCF_2CF_2OCH_2CH_2OCF_2CF_2H$), or mixtures of two or more of the foregoing solvents.

A cosolvent which facilitates the film forming capabilities of a photoresist formulation containing the copolymer of this invention can be used. Illustratively, in one embodiment a fluorinated compound, 1,2-bis(1,1,2,2-tetrafluoroethoxy) ethane, having the structure $HCF_2CF_2OCH_2CH_2OCF_2CF_2H$ is a suitable cosolvent.

Photoactive Component (PAC)

The compositions of this invention contain at least one photoactive component (PAC) that usually is a compound that affords either acid or base upon exposure to actinic radiation. If an acid is produced upon exposure to actinic radiation, the PAC is termed a photoacid generator (PAG). If a base is produced upon exposure to actinic radiation, the PAC is termed a photobase generator (PBG).

Suitable photoacid generators for this invention include, but are not limited to, 1) sulfonium salts (structure I), 2) iodonium salts (structure II), and 3) hydroxamic acid esters, such as structure III.

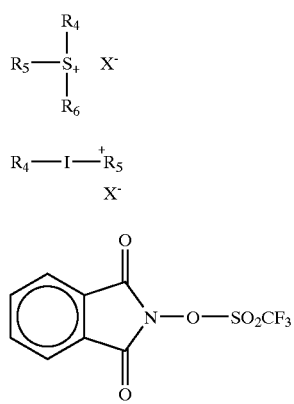

In structures I–II, $R_4$–$R_6$ are independently substituted or unsubstituted aryl or substituted or unsubstituted $C_1$–$C_{20}$ alkylaryl (aralkyl). Representative aryl groups include, but are not limited to, phenyl and naphthyl. Suitable substituents include, but are not limited to, hydroxyl (—OH) and $C_1$–$C_{20}$ alkyloxy (e.g., $C_{10}H_{21}O$). The anion X— in structures I–II can be, but is not limited to, $SbF_6$-(hexafluoroantimonate), $CF_3SO_3$-(trifluoromethylsulfonate=triflate), and $C_4F_9SO_3$-(perfluorobutylsulfonate).

Protective Groups for Removal by PAC Catalysis

A copolymer of this invention contains, in the second repeat unit, and, optionally, in one or more other repeat unit(s), one or more acid groups or protected acid groups (e.g., protected carboxylic acid groups or protected fluoroalcohol groups) that can yield, by catalysis of acids generated photolytically from photoactive compounds (PACs), hydrophilic acid groups which enable development of resist coatings. (A protected acid group is an acid group that is protected with a protecting group.) A given protected acid group is one that is normally chosen on the basis of its being acid labile, such that when photoacid is produced upon imagewise exposure, the acid will catalyze deprotection and production of hydrophilic acid groups that are at this point unprotected and which are necessary for development under aqueous conditions. In addition, copolymers may also contain one or more acid groups that are not protected. The copolymers may contain none, some, or all acid groups that is/are protected. Photoresists comprised of the copolymers of this invention can be heated to promote deprotection necessary for image formation. An acid group when deprotected affords free acid that enhances the solubility, swellability, and/or dispersibility in aqueous environments of the copolymer to which the acid group is bonded.

Nonlimiting examples of components having protected acid groups that yield an acid group as the hydrophilic group upon exposure to photogenerated acid include A) esters capable of forming, or rearranging to, a tertiary cation, B) esters of lactone, C) acetal esters, D) β-cyclic ketone esters, E) α-cyclic ether esters, F) MEEMA (methoxy ethoxy ethyl methacrylate) and other esters which are easily hydrolyzable because of anchimeric assistance, G) carbonates formed from a fluorinated alcohol and a tertiary aliphatic alcohol. Some specific examples in category A) are t-butyl ester, t-amyl ester, 2-methyl-2-adamantyl ester, and isobornyl ester. Some specific examples in category B) are γ-butyrolactone-3-yl, γ-butyrolactone-2-yl, mavalonic lactone, 3-methyl-γ-butyrolactone-3-yl, 3-tetrahydrofuranyl, and 3-oxocyclohexyl. Some specific examples in category C) are 2-tetrahydropyranyl, 2-tetrahydrofuranyl, and 2,3-propylenecarbonate-1-yl. Additional examples in category C) include various esters from addition of vinyl ethers, such as, for example, ethoxy ethyl vinyl ether, methoxy ethoxy ethyl vinyl ether, and acetoxy ethoxy ethyl vinyl ether.

Examples of components having protected acid groups that yield an acid as the hydrophilic group upon exposure to photogenerated acid or base include, but are not limited to, t-butoxycarbonyl (t-BOC), t-butyl ether, and 3-cyclohexenyl ether.

The acid group or protected acid group may also be derived from a fluoroalcohol or fluoroether. One or more of the first repeat unit, the second repeat unit, the third repeat unit or another component may be derived from at least one ethylenically unsaturated compound containing a fluoroalcohol or fluoroether group having the structure:

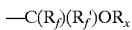

wherein $R_f$ and $R_f'$ are the same or different fluoroalkyl groups of from 1 to about 10 carbon atoms or taken together are $(CF_2)_n$, wherein n is 2 to 10, and $R_x$ is a hydrogen atom or a $C_3$–$C_6$-secondary- or tertiary-alkyl group. A tertiary-alkyl group is preferred.

In one embodiment of the invention, the second repeat unit can be derived from any one or more of the foregoing acid groups or protected acid groups or the second repeat unit can be derived from a tertiary-alkyl acrylates or tertiary-alkyl methacrylates, wherein the alkyl group contains from four to about ten carbon atoms. Tertiary-alkyl acrylates are more preferred. The most preferred monomer comprised of a protected acid group is tertiary-butyl acrylate (tBA).

In this invention, often, but not always, the components having protected acid groups are repeat units having protected acid groups that have been incorporated in the base copolymer. Frequently the protected acid groups are present in one or more monomer(s) that are copolymerized to form a given copolymer of this invention. Alternatively, in this invention, a copolymer can be formed by copolymerization with an acid-containing monomer and then subsequently the acid group can be partially or wholly converted by appropriate means to derivatives having protected acid groups. As one specific example, a copolymer of HFIB/tBA/VF2 (copolymer containing hexafluoroisobutylene, t-butyl acrylate, and vinylidene fluoride) is a copolymer within the scope of the invention having t-butyl ester groups as protected-acid groups.

Dissolution Inhibitors and Additives

Various dissolution inhibitors can be utilized in this invention. Ideally, dissolution inhibitors (DIs) for Deep and vacuum UV resists (e.g., 157 or 193 nm resists) should be designed/chosen to satisfy multiple needs including dissolution inhibition, plasma etch resistance, and adhesion behavior of resist compositions comprising a given DI additive. Some dissolution inhibiting compounds also serve as plasticizers in resist compositions.

A variety of bile-salt esters (i.e., cholate esters) are particularly useful as DIs in the compositions of this invention. Bile-salt esters are known to be effective dissolution inhibitors for deep UV resists, beginning with work by Reichmanis et al. in 1983. (E. Reichmanis et al., "The Effect of Substituents on the Photosensitivity of 2-Nitrobenzyl Ester Deep UV Resists", *J. Electrochem. Soc.* 1983, 130, 1433–1437.) Bile-salt esters are particularly attractive choices as DIs for several reasons, including their availability from natural sources, their possessing a high alicyclic carbon content, and particularly for their being transparent in the Deep and vacuum UV region of the electromagnetic spectrum (e.g., typically they are highly transparent at 193 nm). Furthermore, the bile-salt esters are also attractive DI choices since they may be designed to have widely ranging hydrophobic to hydrophilic compatibilities depending upon hydroxyl substitution and functionalization.

Representative bile-acids and bile-acid derivatives that are suitable as additives and/or dissolution inhibitors for this invention include, but are not limited to, those illustrated below, which are as follows: cholic acid (IV), deoxycholic acid (V), lithocholic acid (VI), t-butyl deoxycholate (VII), t-butyl lithocholate (VIII), and t-butyl-3-α-acetyl lithocholate (IX). Bile-acid esters, including compounds VII–IX, are preferred dissolution inhibitors in this invention.

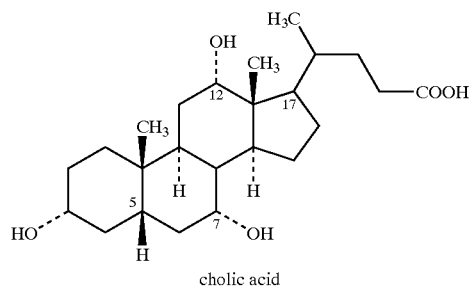

cholic acid

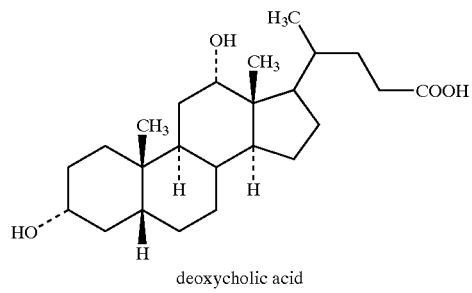

deoxycholic acid

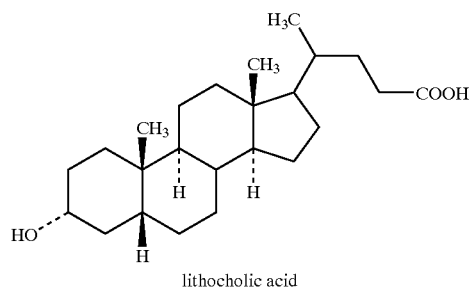

lithocholic acid

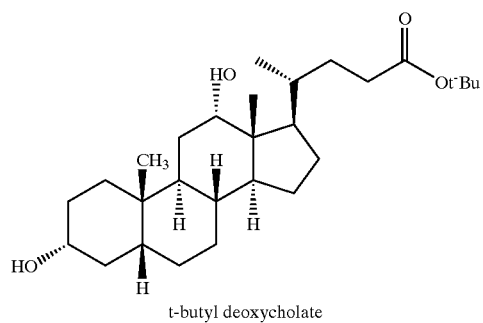

t-butyl deoxycholate

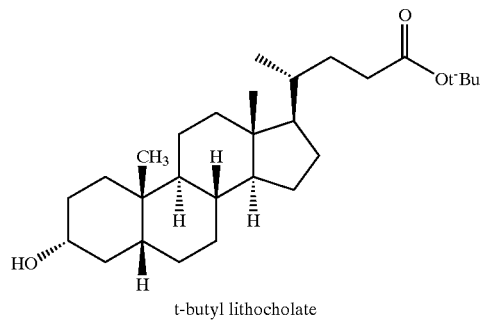

t-butyl lithocholate

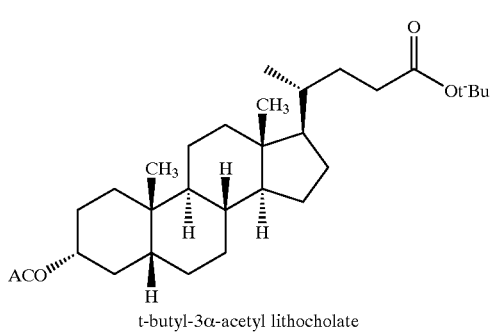

t-butyl-3α-acetyl lithocholate

Components for Negative-Working Photoresist Embodiment

Some embodiments of this invention are negative-working photoresists. These negative-working photoresists comprise at least one binder copolymer comprised of acid-labile groups and at least one photoactive component that affords photogenerated acid. Imagewise exposure of the resist affords photogenerated acid which converts the acid-labile groups to polar groups (e.g., conversion of ester group (less polar) to acid group (more polar)). Development is then done in an organic solvent or critical fluid (having moderate to low polarity), which results in a negative-working system in which exposed areas remain and unexposed areas are removed.

A variety of different crosslinking agents can be employed as required or optional photoactive component(s) in the negative-working compositions of this invention. (A crosslinking agent is required in embodiments that involve insolubilization in developer solution as a result of crosslinking, but is optional in preferred embodiments that involve insolubilization in developer solution as a result of polar groups being formed in exposed areas that are insoluble in organic solvents and critical fluids having moderate/low polarity).

Other Components

The compositions of this invention can contain optional additional components. Examples of additional components which can be added include, but are not limited to, resolution enhancers, adhesion promoters, residue reducers, coating aids, surfactants, plasticizers, and $T_g$ (glass transition temperature) modifiers.

Process Steps

Imagewise Exposure

The photoresist compositions of this invention are sensitive in the ultraviolet region of the electromagnetic spectrum and especially to those wavelengths ≦365 nm. Imagewise exposure of the resist compositions of this invention can be done at many different UV wavelengths including, but not limited to, 365 nm, 248 nm, 193 nm, 157 nm, and lower wavelengths. Imagewise exposure is preferably done with ultraviolet light of 248 nm, 193 nm, 157 nm, or lower wavelengths, more preferably it is done with ultraviolet light of 193 nm, 157 nm, or lower wavelengths, and most preferably, it is done with ultraviolet light of 157 nm or lower wavelengths. Imagewise exposure can either be done digitally with a laser or equivalent device or non-digitally with use of a photomask. Suitable laser devices for imaging of the compositions of this invention include, but are not limited to, an argon-fluorine excimer laser with UV output at 193 nm, a krypton-fluorine excimer laser with UV output at 248 nm, and a fluorine (F2) laser with output at 157 nm. These excimer lasers could be used for digital imaging, but they are also the basis for non-digital imaging using photomasks in optical steppers. Optical steppers for 248 nm can use lamps or KrF excimer laser light sources, and at 193 and 157 nm the light source is an excimer laser, 193 nm=ArF and 157 nm=F2 excimer laser. Since, as discussed supra, use of UV light of lower wavelength for imagewise exposure corresponds to higher resolution (lower resolution limit), the use of a lower wavelength (e.g., 193 nm or 157 nm or lower) is generally preferred over use of a higher wavelength (e.g., 248 nm or higher).

Development

The copolymers of this invention can be formulated as a positive resist wherein the areas exposed to UV light become sufficiently acidic to be selectively washed out with aqueous base. Sufficient acidity is imparted to the copolymers by acid or protected acid (which can be 100% in protected form prior to exposure provided deprotection occurs during exposure to afford sufficient free acid to provide for development) such that aqueous development is possible using a basic developer such as sodium hydroxide solution, potassium hydroxide solution, or tetramethylammonium hydroxide solution. In this invention, a given copolymer for aqueous processability (aqueous development) in use is typically a carboxylic acid-containing and/or fluoroalcohol-containing copolymer (after exposure) containing at least one free carboxylic acid group and/or fluoroalcohol group. The level of acid groups (e.g., free carboxylic acid or fluoroalcohol groups) is determined for a given composition by optimizing the amount needed for good development in aqueous alkaline developer.

When an aqueous processable photoresist is coated or otherwise applied to a substrate and imagewise exposed to UV light, the copolymer of the photoresist must have sufficient protected acid groups and/or unprotected acid groups so that when exposed to UV the exposed photoresist will become developable in basic solution. In case of a positive-working photoresist layer, the photoresist layer will be removed during development in portions which are exposed to UV radiation but will be substantially unaffected in unexposed portions during development by aqueous alkaline liquids such as wholly aqueous solutions containing 0.262 N tetramethylammonium hydroxide (with development at 25° C. usually for less than or equal to 120 seconds) or 1% sodium carbonate by weight (with development at a temperature of 30° C. usually for less than 2 or equal to 2 minutes). In case of a negative-working photoresist layer, the photoresist layer will be removed during development in portions which are unexposed to UV radiation but will be substantially unaffected in exposed portions during development using either a critical fluid or an organic solvent.

A critical fluid, as used herein, is one or more substances heated to a temperature near or above its critical temperature and compressed to a pressure near or above its critical pressure. Critical fluids in this invention are at least at a temperature that is higher than 15° C. below the critical temperature of the fluid and are at least at a pressure higher than 5 atmospheres below the critical pressure of the fluid. Carbon dioxide may be used for the critical fluid in the present invention. Various organic solvents can also be used as developer in this invention. These include, but are not limited to, halogenated solvents and non-halogenated solvents. Halogenated solvents are preferred and fluorinated solvents are more preferred.

| GLOSSARY | |
|---|---|
| Analytical/Measurements | |
| δ | NMR chemical shift measured in the indicated solvent |
| g | gram |
| NMR | Nuclear Magnetic Resonance |
| $^1$H NMR | Proton NMR |
| $^{13}$C NMR | Carbon-13 NMR |
| s | singlet |
| m | multiplet |
| mL | milliliter(s) |
| mm | millimeter(s) |
| n | Index of Refraction |
| $T_g$ | Glass Transition Temperature |
| $M_n$ | Number-average molecular weight of a given copolymer determined by gel permeation chromatography using polystyrene standard |
| $M_w$ | Weight-average molecular weight of a given copolymer determined by gel permeation chromatography using polystyrene standard |
| Absorbance | A = absorbance of a sample = $\log_{10}(1/T)$, where T = transmittance as defined below. |
| Optical absorbance per micron (Absorbance per micron) | A/μm = A/t, where A = optical absorbance and t = film thickness in microns. |
| Transmittance | Transmittance, T, = ratio of the radiant power transmitted by a sample to the radiant power incident on the sample and is measured for a specified wavelength λ (e.g., nm). |
| Chemicals/Monomers | |
| AIBN | 2,2'-azobisisobutyronitrile Aldrich Chemical Co., Milwaukee, WI |
| CFC-113 | 1,1,2-Trichlorotrifluoroethane (E. I. du Pont de Nemours and Company, Wilmington, DE) |
| DFIH | Decafluroisohexylene = 2-perfluoroethyl-3,3,4,4,4-pentafluoro-1-butene |
| HFIB | Hexafluoroisobutylene = 2-trifluoromethyl-3,3,3-trifluoro-1-propene |
| NB | Norbornene = Bicyclo[2.2.1]hept-2-ene Aldrich Chemical Co., Milwaukee, WI |
| THF | Tetrahydrofuran Aldrich Chemical Co., Milwaukee, WI |
| tBA | Tertiary-Butyl acrylate |
| Vazo ® 52 | 2,4-Dimethyl-2,2'-azobis(pentanenitrile) (E. I. du Pont de Nemours and Company, Wilmington, DE) |
| Vazo ® 67 | 2,2'-Azobis(2-methyl butyronitrile) (E. I. du Pont de Nemours and Company, Wilmington, DE) |
| PGMEA | Propylene glycol methyl ether acetate Aldrich Chemical Co., Milwaukee, WI |
| SELECTED STRUCTURES | |

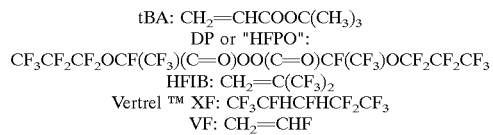

| | |
|---|---|
| VF2: $CH_2=CF_2$ | |
| VAc: $CH_2=CHO(C=O)CH_3$ | |
| Ultraviolet | |
| UV | Ultraviolet region of the electromagnetic spectrum which ranges from 10 nanometers to 390 nanometers |
| Extreme UV (EUV) | Region of the electromagnetic spectrum in the ultraviolet that ranges from 10 nanometers to 30 nanometers |
| Vacuum UV (VUV) | Region of the electromagnetic spectrum in the ultraviolet that ranges from 30 nanometers to 200 nanometers |
| Deep UV | Region of the electromagnetic spectrum in the ultraviolet that ranges from 200 nanometers to 300 nanometers |
| Near UV | Region of the electromagnetic spectrum in the ultraviolet that ranges from 300 nanometers to 390 nanometers |
| Copolymers | |
| P(A/B/C) X/Y/Z | Copolymer from copolymerization of A, B, and C containing X molar parts of repeat units derived from A, Y molar parts of repeat units derived from B, and Z molar parts of repeat units derived from C |

EXAMPLES

Unless otherwise specified, all temperatures are in degrees Centigrade, all mass measurements are in grams, and all percentages, with the exception of percentages of repeat units derived from comonomers, are weight percentages. All parts and percentages of repeat units derived from monomers present in the copolymers of this invention are expressed in molar parts and mole percentages, respectively, unless otherwise indicated. All molecular weight determinations were made by GPC using polystyrene standard.

Most often, copolymer compositions were estimated by carbon/hydrogen analysis in which case compositions were believed accurate within 10 to 15 mole percent. As an alternate method, copolymer compositions were occasionally determined by Carbon-13 NMR in which case compositions were believed accurate within 5 to 10 mole percent.

The optical absorbance per micron of a film containing the copolymer of this invention was determined by forming a film of the copolymer onto a substrate. This was accomplished by the standard procedure of spin coating a solution of the copolymer of this invention onto a $CaF_2$ substrate and followed by drying the coated substrate. The optical absorbance was measured per micron of film thickness. The VUV transmission of each $CaF_2$ substrate was measured prior to coating of the substrate. Then the VUV transmission of the coated substrate was measured, and using the measured film thickness, the optical absorbance per micron for the film, as a function of wavelength, was determined, which included the values of the optical absorbance per micron for wavelengths of 157 nm and 193 nm.

The VUV transmission of the $CaF_2$ substrates and the films on the $CaF_2$ substrates were measured with a VUV Spectrophotometer using a laser plasma light source, a sample chamber capable of both transmission and reflectance measurements, a 1 meter monochromator and a sodium salicylate phosphor coated 1024 element photodiode detector. This procedure is discussed in greater detail in R. H. French, "Laser-Plasma Sourced, Temperature Dependent VUV Spectrophotometer Using Dispersive Analysis", *Physica Scripta*, 41, 4, 404–8, (1990)). The VUV transmission was compared to, and if necessary scaled to match, the UV transmission of the samples measured using a Perkin Elmer Lambda 9 UV/visible spectrophotometer (Perkin Elmer Analytical Instruments, 761 Main Avenue, Norwalk Conn. 06859).

The VUV transmission of the $CaF_2$ substrates and the copolymer films on the $CaF_2$ substrates for Examples 8, 9 and 10 were measured with a VUV Ellipsometer capable of transmission and reflectance measurements. This VUV Ellipsometer uses a deuterium and Xenon lamp light sources, a double monochromator, an AutoRetarder for greater accuracy and a photomultiplier and a photodiode detector.

The analytical procedures and their accuracy, the VUV spectrophotometer and the VUV Ellipsometry are discussed in greater detail in R. H. French, R. C. Wheland, D. J. Jones, J. N. Hilfiker, R. A. Synowicki, F. C. Zumsteg, J. Feldman, A. E. Feiring, "Fluoropolymercopolymers for 157 nm Lithography: Optical Properties from VUV Absorbance and Ellipsometry Measurements", Optical Microlithography XIII, SPIE Vol. 4000, edited by C. J. Progler, 1491–1502 (2000).

More specifically, all optical absorbance per micron measurements were made using the procedure listed below.

Samples were first spin-coated on silicon wafers on a Brewer Cee (Rolla, Mo.), Spincoater/Hotplate model 100CB.

a) Two to four silicon wafers were spun at different speeds (e.g., 2000, 3000, 4000, 6000 rpm) to obtain differing film thickness and the coated wafers were subsequently baked at 80° C. for 2 min. The dried films were then measured for thickness on a Filmetrics F20 Film Measurement System (Filmetrics, Inc., 7675 Dagget St., Suite 140, San Diego, Calif. 92111-2255) or on a Dektak Stylus Profiler Model IIA, (Veeco Metrology Group, 112 Robin Hill Road, Santa Barbara, Calif. 93117). Spin speeds were then selected from this data to spin the $CaF_2$ substrates for the spectrometer measurement.

b) $CaF_2$ substrates (½" dia.×0.040" thick) were selected and the transmission of the substrate determined on the VUV Spectrophotometer or the VUV Ellipsometer.

c) Spin speed was selected from the silicon wafer data from a) to spin the sample material onto the $CaF_2$ reference substrates (e.g., 2000 and 6000 rpm) to achieve the desired film thickness. It was baked at 80° C. for 2 min. and the transmission of the film on the substrate was collected on the VUV Spectrometer or the VUV Ellipsometer.

The optical absorbance per micron, which is the absorbance A per micron of film thickness, is defined in Equation 1 as the base 10 logarithm of the ratio of the substrate transmission divided by the transmission of the sample consisting of the film sample on its substrate, this quantity divided by the film thickness t.

$$A/\mu m_{film} = A_{film}/t_{film} = \log_{10}\{T_{substrate}/T_{sample}\}/t_{film} \quad \text{Equation 1.}$$

Wherein:

$A/\mu m_{film}$ is the optical absorbance per micron in units of $\mu m^{-1}$ of a given film determined for a specified wavelength of light.

$A_{film}$ is the absorbance (unitless) of a given film determined for a specified wavelength of light.

$T_{substrate}$ is the transmittance (unitless) of a substrate (e.g. a calcium fluoride plate) determined for a specified wavelength of light.

$T_{sample}$ is the transmittance (unitless) of a sample of a given film and a substrate determined for a specified wavelength of light.

$t_{film}$ is thickness of a given film in microns.

In this manner, the optical absorbance per micron $A/\mu m$ has units of inverse microns (or 1/micron, where a micron, is a micrometer or $\mu m$ of film thickness). The absorbance/micron of films were measured for films spun coated on to $CaF_2$ substrates using the above-described methods. The VUV transmission of each $CaF_2$ substrate was measured prior to the spin coating of the film. Then the VUV transmission of the film on that particular $CaF_2$ substrate was measured, and using the measured film thickness (reported in Table 1) and equation 1, the values of the absorbance/micron for the copolymers, as a function of wavelength were determined, and the values of the absorbance/micron for wavelengths of 157 nm and 193 nm are tabulated in Table 2.

TABLE 2

Optical Absorbance per Micron ($\mu m^{-1}$) of Base Resins and Formulated Resists

| Example # | Base Resin Name | A/$\mu$m (157 nm) | A/$\mu$m (193 nm) | Thick. (Å) | Spin Speed (Rpm) |
|---|---|---|---|---|---|
| 1 | P(HFIB/VF/tBA) | 2.89 | 0.01 | 866 | 6 k |
| 2 | P(HFIB/VF/tBA) | 3.64 | 0.08 | 1606 | 6 k |
| 3 | P(HFIB/VF2/tBA) | 2.12 | 0.07 | 838 | 6 k |
| 4 | P(HFIB/VF2/tBA) | 1.57 | 0.15 | 760 | 6 k |
| 5 | P(HFIB/Vac/tBA) | 2.16 | 0.03 | 763 | 6 k |
| 6 | P(HFIB/tBA) | | | | |
| 7 | P(HFIB/VF2/tBA) | 4.33 | 0.13 | 1584 | 6 k |
| 8 | P(HFIB/VF/tBMA) | 4.69 | 0.20 | 7930 | 2 k |
| 8 | P(HFIB/VF2/tBMA) Resist 8B | 5.37 | 0.83 | 1108 | 6 k |
| 9 | P(HFIB/VF/tBMA) | 4.40 | 0.22 | 10003 | 2 k |
| 9 | P(HFIB/VF/tBMA) Resist 9A | 5.71 | 0.88 | 2284 | 6 k |
| 9 | P(HFIB/VF/tBMA) Resist 9B | 6.43 | 1.08 | 1188 | 6 k |
| 10 | P(HFIB/tBA) | 3.74 | 0.12 | 9510 | 2 k |
| 10 | P(HFIB:tBA) Resist 10B | 5.43 | 0.81 | 1160 | 6 k |

Image Formation/Lithographic Evaluation

With respect to photoresist exposure, the term "clearing dose" indicates the minimum exposure energy density (e.g., in units of $mJ/cm^2$) to enable a given photoresist film, following exposure, to undergo development.

EXAMPLE 1

Poly(Hexafluoroisobutylene/Vinyl Fluoride/t-Butyacrylate) (0.25/0.25/0.5 )

Copolymer Synthesis

A 210 ml stainless steel autoclave was loaded with 15 ml CF2ClCCl2F and 14 ml of t-butylacrylate (tBA). After chilling to less than −20° C., 20 ml of about 0.18 M DP in Vertrel™ XF were added. The autoclave was sealed, chilled, evacuated, and 64 g of hexafluoroisobutylene (HFIB) and 4 g of vinyl fluoride (VF) added. The reaction mixture was shaken overnight (about 21 hours) at ambient temperature, reaching a peak of 34.9 psi (241 kPa) at 22.2° C. The fluid reaction mixture was evaporated to dryness, put under pump vacuum for a week, and then dried in a 65–90° C. vacuum oven for 7 hours. This gave 14 g of brittle solid, which was characterized below.

Calc. $(HFIB)_{0.25}(VF)_{0.25}(tBA)_{0.5}$: 51.50C; 6.27H

Found: 51.25C; 6.24H

Optical Absorbance per Micron Determination

A solution of this copolymer [P(HFIB/VF/tBA) (0.25/0.25/0.5)] was spin coated from 2-heptanone at a spin speed of 6000 rpm onto $CaF_2$ substrates to produce copolymer film of 866 angstroms thickness. VUV absorbance measurements were then used to determine the absorbance per micron as explained supra.

Figure 1:
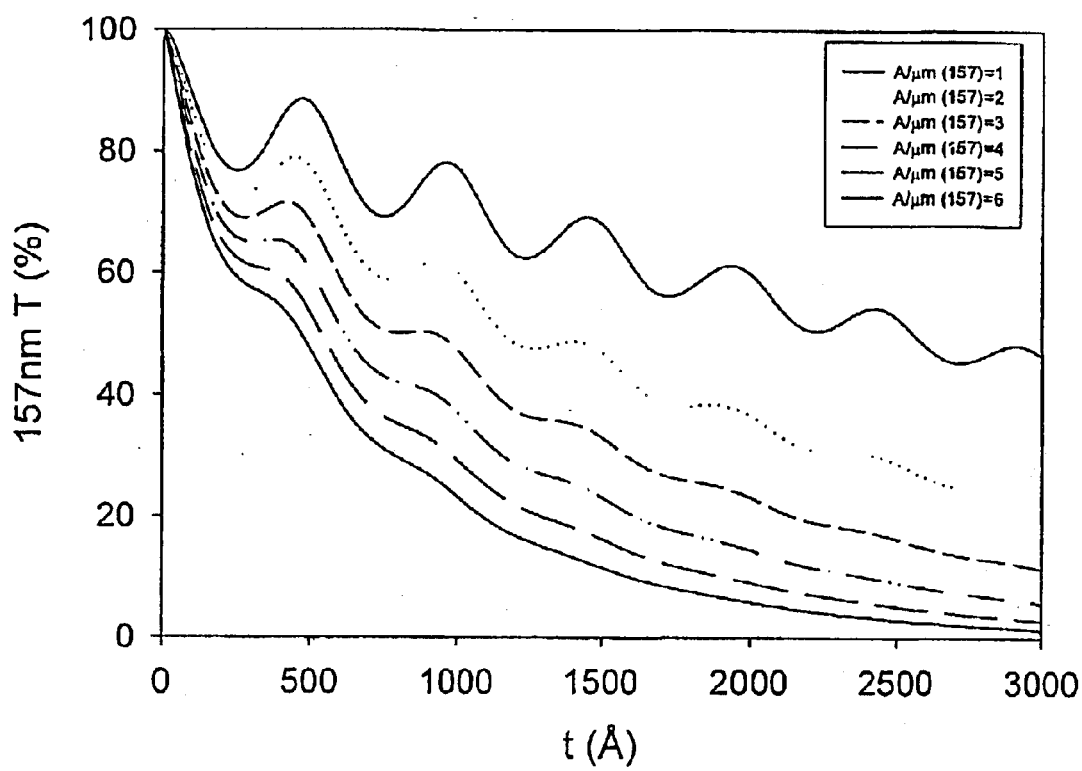
FIG. 1 is a plot of the % transmission (T) at 157 nm of resist films with optical absorbance per micron at 157 nm in units of inverse microns of $1/\mu m$ to $6/\mu m$ versus the resist film thickness (t) in angstroms. Transmission was calculated for air underlying the resist film so as to neglect the underlying semiconductor wafer.
Figure 2:
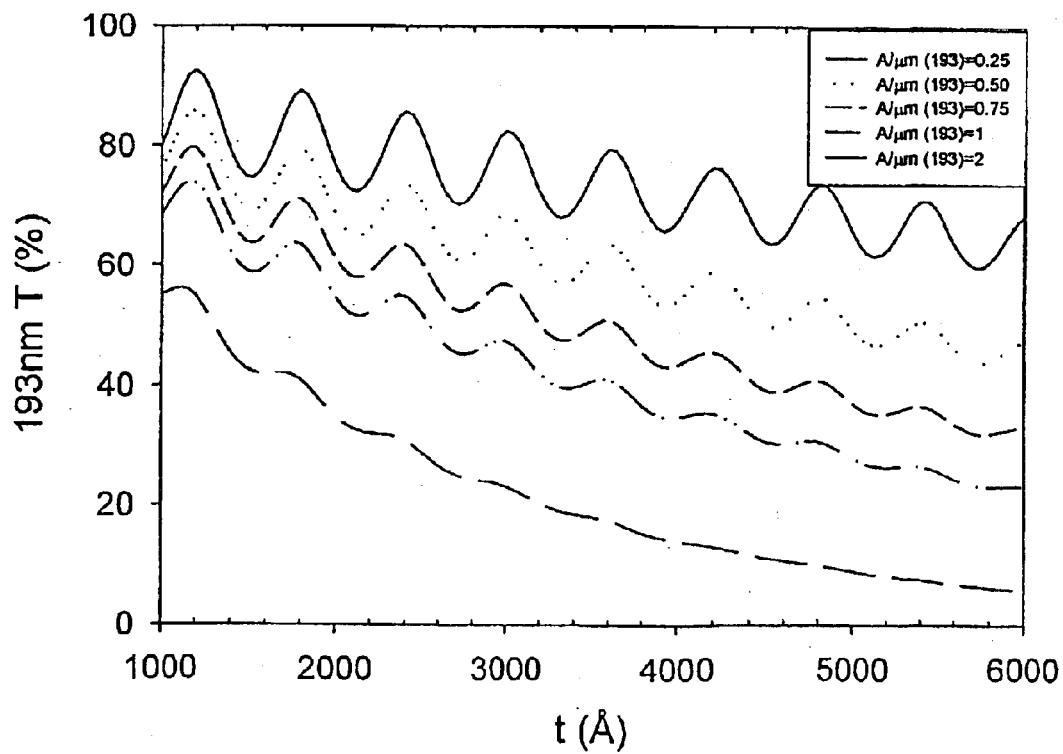
FIG. 2 is a plot of the % transmission (T) at 193 nm of resist films with optical absorbance per micron at 193 nm in units of inverse microns of $1/\mu m$ to $2/\mu m$ versus the resist film thickness (t) in angstroms. Transmission was calculated for air underlying the resist film so as to neglect the underlying semiconductor wafer.
Figure 3:
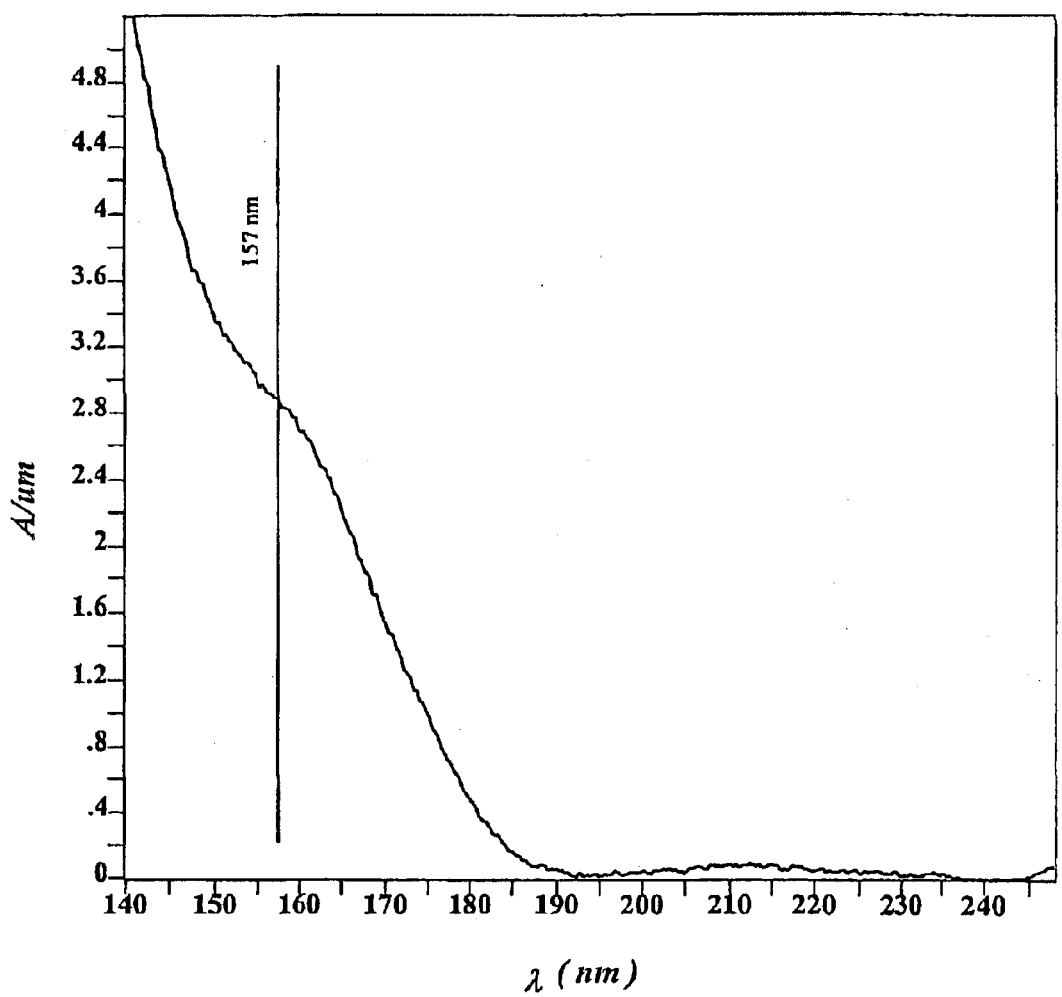
FIG. 3 is a plot of the optical absorbance per micron in units of inverse microns for P(HFIB/VF/tBA) (copolymer of Example 1) versus wavelength lambda (λ) in units of nanometers.

The optical absorbance per micron in units of inverse microns for P(HFIB/VF/tBA) versus wavelength lambda ($\lambda$) in units of nanometers is shown in FIG. 3. The optical absorbance per micron at 157 nm determined from the copolymer film is 2.89/micron. The optical absorbance per micron at 193 nm determined from the copolymer film is 0.01/micron.

Image Generation/Lithographic Evaluation

The following solution was prepared and magnetically stirred overnight at ambient temperature.

| Component | Wt. (gm) |
|---|---|
| HFIB/VF/tBA copolymer (0.25/0.25/0.5) as described in this example. | 0.294 |
| Cyclohexanone | 2.586 |
| 5% (wt) solution of triphenylsulfonium triflate dissolved in cyclohexanone which had been filtered through a 0.45μ PTFE syringe filter. | 0.120 |

A thin film was prepared for lithographic evaluation by spin coating the above formulation on a 4 inch (10.2 cm) diameter Type "P", <100> orientation, silicon wafer. Spin coating was done using a Brewer Science Inc. Model-100CB combination spin coater/hotplate. Development was performed on a Litho Tech Japan Co. Resist Development Analyzer (Model-790).

The wafer was prepared by depositing 6 ml of hexamethyldisilazane (HMDS) primer and spinning at 1000 rpm for 5 sec. and then 3500 rpm for 10 sec. Then 6 ml of the above solution, after filtering through a 0.45 μm PTFE syringe filter, was deposited and spun at 3000 rpm for 60 seconds and baked at 120° C. for 60 seconds.

248 nm imaging was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 30 seconds, providing an unattenuated dose of 20.5 mJ/cm2. By using a mask with 18 positions of varying neutral optical density, a wide variety of exposure doses were generated. After exposure, the exposed wafer was baked at 120° C. for 120 seconds.

The wafer was developed in aqueous tetramethylammonium hydroxide (TMAH) solution (ONKA NMD-3, 2.38% TMAH solution). Development time was 60 sec. A positive image was produced on the wafer with a clearing dose of approximately 21 mJ/cm$^2$.

EXAMPLE 2

Poly(Hexafluoroisobutylene/Vinyl Fluoride/t-Butyacrylate) (0.22/0.39/0.39)

Copolymer Synthesis

A 210 ml stainless steel autoclave was loaded with 15 ml $CF_2ClCCl_2F$ and 14 ml of t-butylacrylate (tBA). After chilling to less than −20° C., 20 ml of about 0.16 M DP in Vertrel™ XF were added. The autoclave was sealed, chilled, evacuated, and 32 g of hexafluoroisobutylene and 5 g of vinyl fluoride added. The reaction mixture was shaken overnight (about 12 hours) at ambient temperature, reaching a peak of 207 psi (1430 kPa) at 24.8° C. The fluid reaction mixture was evaporated to dryness, put under pump vacuum for 18 hours, and then dried in 75° C. vacuum oven for 30 hours. This gave 17 g of brittle solid, which was characterized below. DSC analysis indicated a Tg (glass transition temperature) at 46° C. (first heat, $N_2$, 10° C./min).

Calc. $(HFIB)_{0.22}(VF)_{0.39}(tBA)_{0.39}$: 50.74C; 6.11H

Found: 50.58C; 6.15H

Optical Absorbance Per Micron Determination

Solutions of P(HFIB/VF/tBA) (0.22/0.39/0.39) were spin coated from ethyl lactate at spin speeds of 6000 rpm onto $CaF_2$ substrates to produce films of 1606 angstroms thickness. VUV absorbance measurements were then used to determine the optical absorbance per micron.

Figure 4:
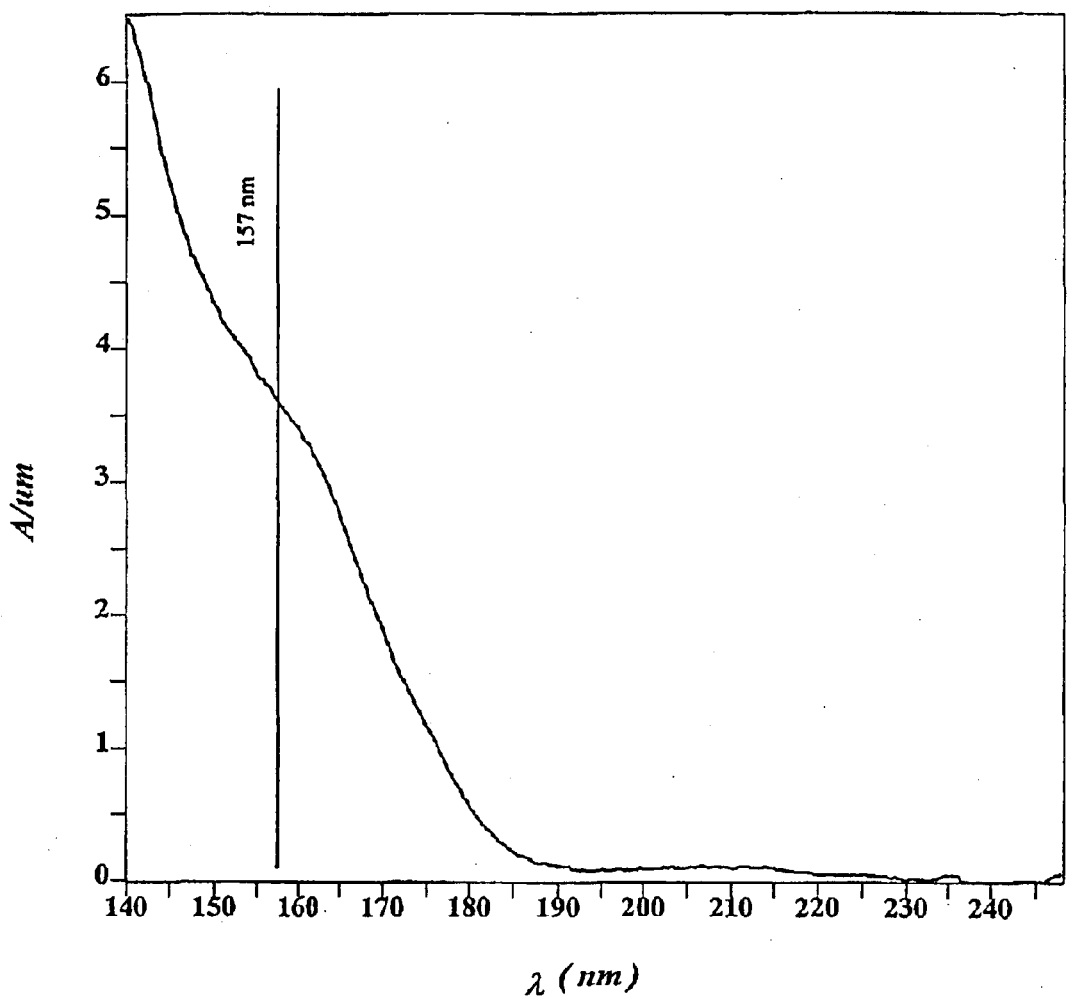
FIG. 4 is a plot of the optical absorbance per micron in units of inverse microns for P(HFIB/VF/tBA) (copolymer of Example 2) versus wavelength lambda (λ) in units of nanometers.

The optical absorbance per micron in units of inverse microns for P(HFIB/VF/tBA) (0.22/0.39/0.39) versus wavelength lambda ($\lambda$) in units of nanometers is shown in FIG. 4. The optical absorbance per micron at 157 nm determined from the film is 3.64/micron. The optical absorbance per micron at 193 nm determined from the film is 0.08/micron.

Image Generation/Lithographic Evaluation

The following solution was prepared and magnetically stirred overnight at ambient temperature.

| Component | Wt. (gm) |
|---|---|
| P(HFIB/VF/tBA) copolymer (0.22/0.39/0.39) as described in this example. | 0.234 |
| Cyclohexanone | 2.586. |
| t-Butyl Lithocholate | 0.060 |
| 5% (wt) solution of triphenylsulfonium triflate dissolved in cyclohexanone which had been filtered through a 0.45μ PTFE syringe filter. | 0.120 |

This solution was subjected to the image generation/lithographic evaluation procedure as described in Example 1. A positive image was produced on the wafer with a clearing dose of approximately 6.9 mJ/cm$^2$.

EXAMPLE 3

Poly(Hexafluoroisobutylene/Vinylidene Fluoride/t-Butyacrylate) (0.25/0.2/0.55)

Copolymer Synthesis

A 210 ml stainless steel autoclave was loaded with 15 ml Vertrel™ XF and 10 ml of t-butylacrylate (tBA). After chilling to less than −20° C., 20 ml of about 0.18 M DP in Vertrel™ XF were added. The autoclave was sealed, chilled, evacuated, and 32 g of hexafluoroisobutylene and 8 g of vinylidene fluoride added. The reaction mixture was shaken overnight (about 20 hours) at ambient temperature, reaching a peak of 79 psi (540 kPa) at 20.6° C. The fluid reaction mixture was evaporated to dryness, put under pump vacuum for a week, and dried for 7 hours in a 65–90° C. vacuum oven. This gave 13 g of brittle solid, which was characterized as given below.

Calc. $(HFIB)_{0.25}(VF2)_{0.20}(tBA)_{0.55}$: 50.72C; 6.08H

Found: 50.66; 6.13H

Optical Absorbance Per Micron Determination

Solutions of this copolymer [P(HFIB/VF2/tBA) (0.25/0.2/0.55)] were spin coated from 2-heptanone at spin speeds of 6000 rpm onto $CaF_2$ substrates to produce copolymer films of 838 angstroms thickness. VUV absorbance measurements were then used to determine the optical absorbance per micron.

Figure 5:
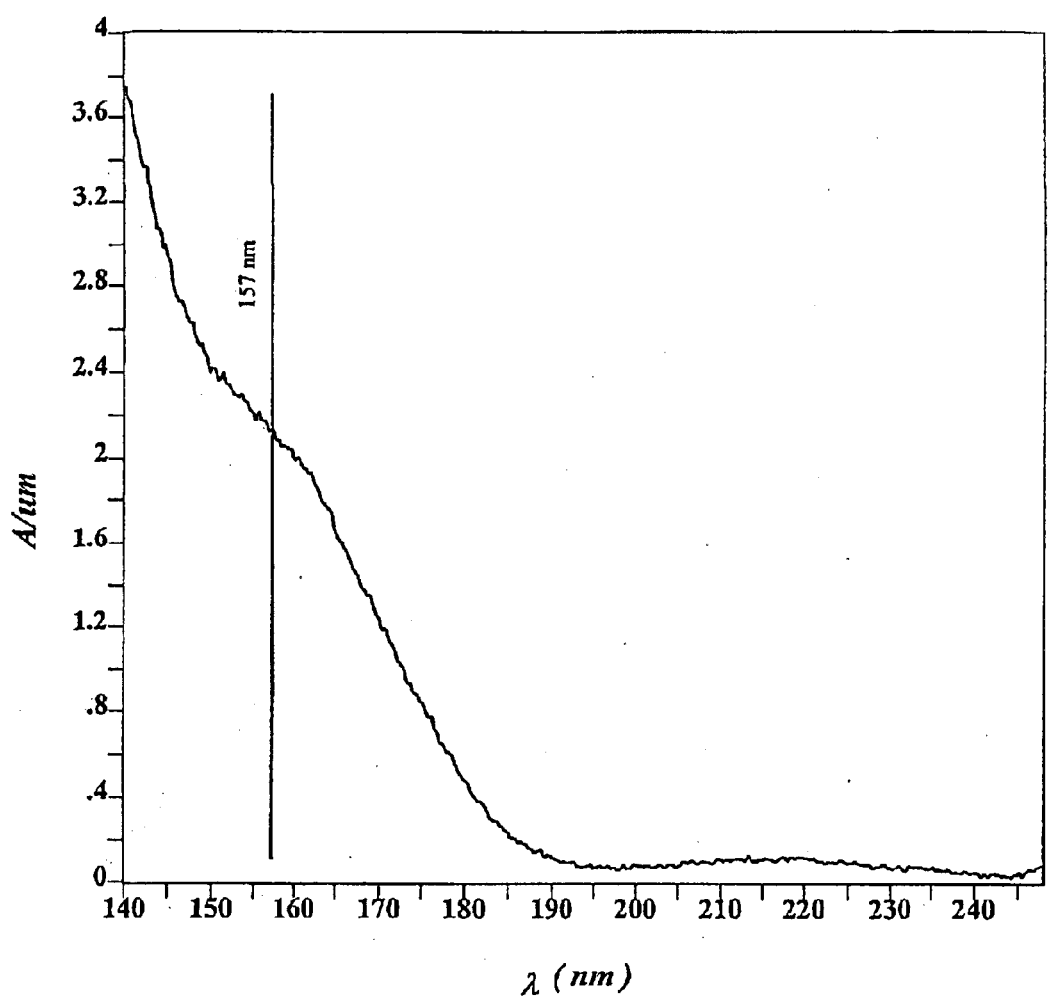
FIG. 5 is a plot of the optical absorbance per micron in units of inverse microns for P(HFIB/VF2/tBA) (copolymer of Example 3) versus wavelength lambda (λ) in units of nanometers.

The optical absorbance per micron in units of inverse microns for P(HFIB:VF2:tBA) (0.25/0.2/0.55) versus wavelength lambda (λ) in units of nanometers is shown in FIG. 5. The optical absorbance per micron at 157 nm determined from the copolymer film is 2.12/micron. The optical absorbance per micron at 193 nm determined from the copolymer film is 0.07/micron.

Image Generation/Lithographic Evaluation

The following solution was prepared and magnetically stirred overnight at ambient temperature.

| Component | Wt. (gm) |
| --- | --- |
| HFIB/VF2/tBA copolymer (0.25/0.2/0.55) as described in this example. | 0.234 |
| Cyclohexanone | 2.586. |
| t-Butyl Lithocholate | 0.060 |
| 5% (wt) solution of triphenylsulfonium triflate dissolved in cyclohexanone which had been filtered through a 0.45μ PTFE syringe filter. | 0.120 |

This solution was subjected to the image generation/lithographic evaluation procedure as described in Example 1. A positive image was produced on the wafer with a clearing dose of approximately 21 mJ/cm².

EXAMPLE 4

Poly(Hexafluoroisobutylene/Vinylidene Fluoride/t-Butylacrylate) (0.29/0.29/0.42)

Copolymer Synthesis

A 210 ml stainless steel autoclave was loaded with 15 ml Vertrel™ XF and 5 ml of t-butylacrylate (tBA). After chilling to less than −20° C., 20 ml of about 0.18 M DP in Vertrel™ XF were added. The autoclave was sealed, chilled, evacuated, and 32 g of hexafluoroisobutylene and 8 g of vinylidene fluoride added. The reaction mixture was shaken overnight (about 20 hours) at ambient temperature, reaching a peak of 69 psi (470 kPa) at 21.1° C. The fluid reaction mixture was evaporated to dryness, put under pump vacuum for a week, and dried for 7 hours in a 65–90° C. vacuum oven. This gave 7.7 g of brittle solid, which was characterized as indicated below.

Calc. $(HFIB)_{0.29}(VF2)_{0.29}(tBA)_{0.42}$: 46.74C; 5.18H

Found: 46.59C; 5.30H

Optical Absorbance Per Micron Determination

Solutions of P(HFIB:VF2:tBA) (0.29/0.29/0.42) were spin coated from 2-heptanone at spin speeds of 6000 rpm onto $CaF_2$ substrates to produce copolymer films of 760 angstroms thickness. VUV absorbance measurements were then used to determine the optical absorbance per micron.

Figure 6:
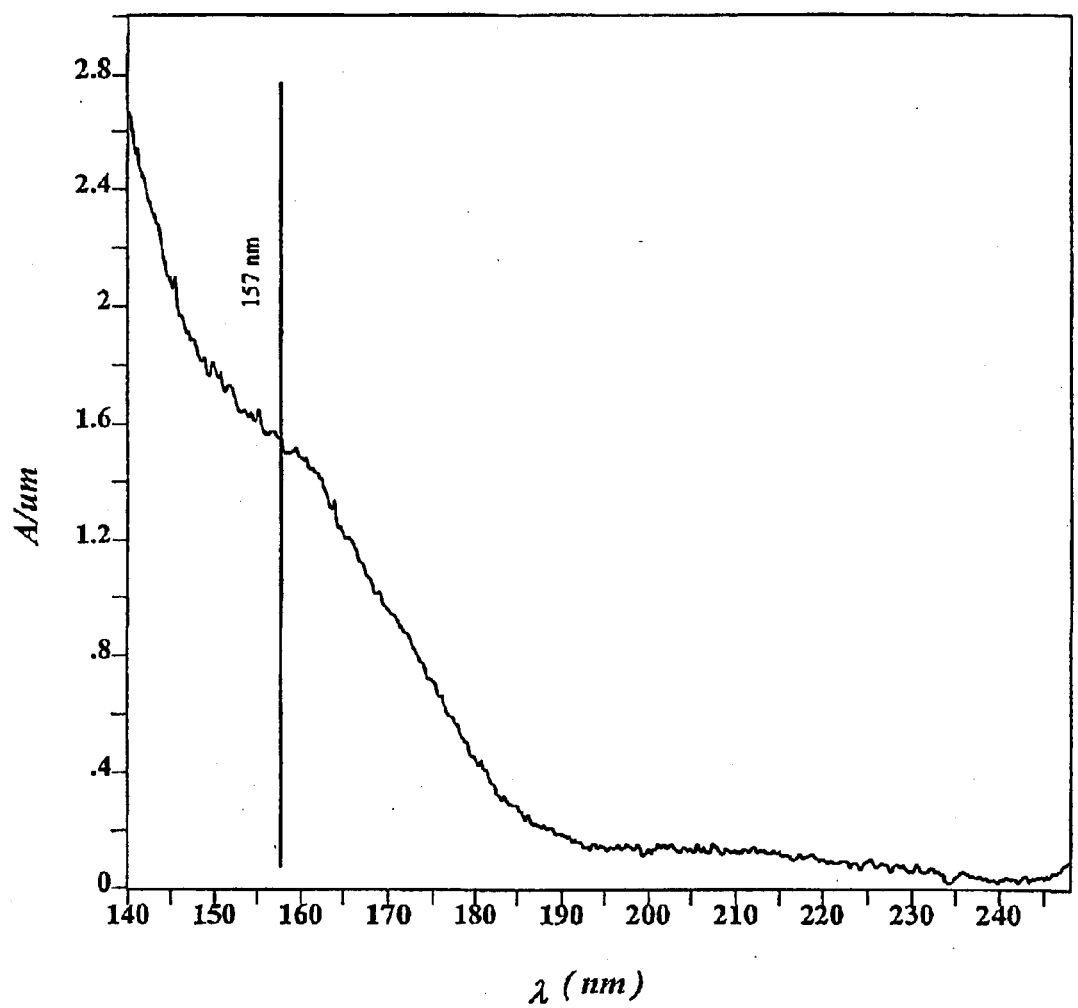
FIG. 6 describes the optical absorbance per micron in units of inverse microns for P(HFIB/VF2/tBA) (copolymer of Example 4) versus wavelength lambda (λ) in units of nanometers.

The optical absorbance per micron in units of inverse microns for P(HFIB/VF2/tBA) (0.29/0.29/0.42) versus wavelength lambda (λ) in units of nanometers is shown in FIG. 6. The optical absorbance per micron at 157 nm determined from the copolymer film is 1.57/micron. The optical absorbance per micron at 193 nm determined from the copolymer film is 0.15/micron.

Image Generation/Lithographic Evaluation

The following solution was prepared and magnetically stirred overnight at ambient temperature.

| Component | Wt. (gm) |
| --- | --- |
| HFIB/VF2/tBA copolymer (0.29/0.29/0.42) as described in this example. | 0.234 |
| Cyclohexanone | 2.586. |
| t-Butyl Lithocholate | 0.060 |
| 5% (wt) solution of triphenylsulfonium triflate dissolved in cyclohexanone which had been filtered though a 0.45μ PTFE syringe filter. | 0.120 |

This solution was subjected to the image generation/lithographic evaluation procedure as described in Example 1. A positive image was produced on the wafer with a clearing dose of approximately 12.6 mJ/cm².

In a 1:1 ratio poly(hexafluoroisobutylene:vinyl fluoride) has an A/μ=0.014 at 157 nm. This hexafluoroisobutylene:vinyl fluoride polymer still needs a photochemical switch to perform as a resist but the functionality associated with a photochemical switch such as t-butyl acrylate tends to increase absorption considerably over that of the base polymer. Comparing Examples 1 and 2, poly (hexafluoroisobutylene:vinyl fluoride:t-butylacrylate) was found to have an A/μ of 2.89 and 3.64 at 157 nm. Replacing the vinyl fluoride in Examples 1 and 2 by the alternating monomer vinylidene fluoride in Examples 3 and 4 reduced A/μ to 1.57 and 2.16 at 157 nm. These data demonstrate the advantage of alternating short $(CH_2)_n$ and $(CF_2)_m$ segments in the polymer for increasing transparency.

EXAMPLE 5

Poly(Hexafluoroisobutylene/Vinyl Acetate/t-Butyacrylate) (0.46/0.27/0.27)

Copolymer Synthesis

A 210 ml stainless steel autoclave was loaded with 50 ml Freon™ 113, 4 ml of vinyl acetate, and 9 ml of t-butylacrylate. The tube was chilled to less than −20° C. and 20 ml of about 0.18 M DP in Vertrel™ XF added. The autoclave was sealed, chilled, evacuated, and 66 g of hexafluoroisobutylene added. The reaction mixture was shaken overnight (about 20 hours) at ambient temperature, reaching a peak of 10 psi (69 kPa) at 22° C. The fluid reaction mixture was evaporated to dryness, put under pump vacuum for a week, and dried for 7 hours in a 65–90° C. vacuum oven. This gave 21 g of brittle solid, which was characterized as indicated below.

Calc. $(HFIB)_{0.46}(VAc)_{0.27}(tBA)_{0.27}$: 43.51C; 4.41H

Found: 43.21C; 4.63H

Optical Absorbance Per Micron Determination

Solutions of P(HFIB/VAc/tBA) (0.46/0.27/0.27) were spin coated from 2-heptanone at spin speeds of 6000 rpm onto $CaF_2$ substrates to produce copolymer films of 763 angstroms thickness. VUV absorbance measurements were then used to determine the optical absorbance per micron.

Figure 7:
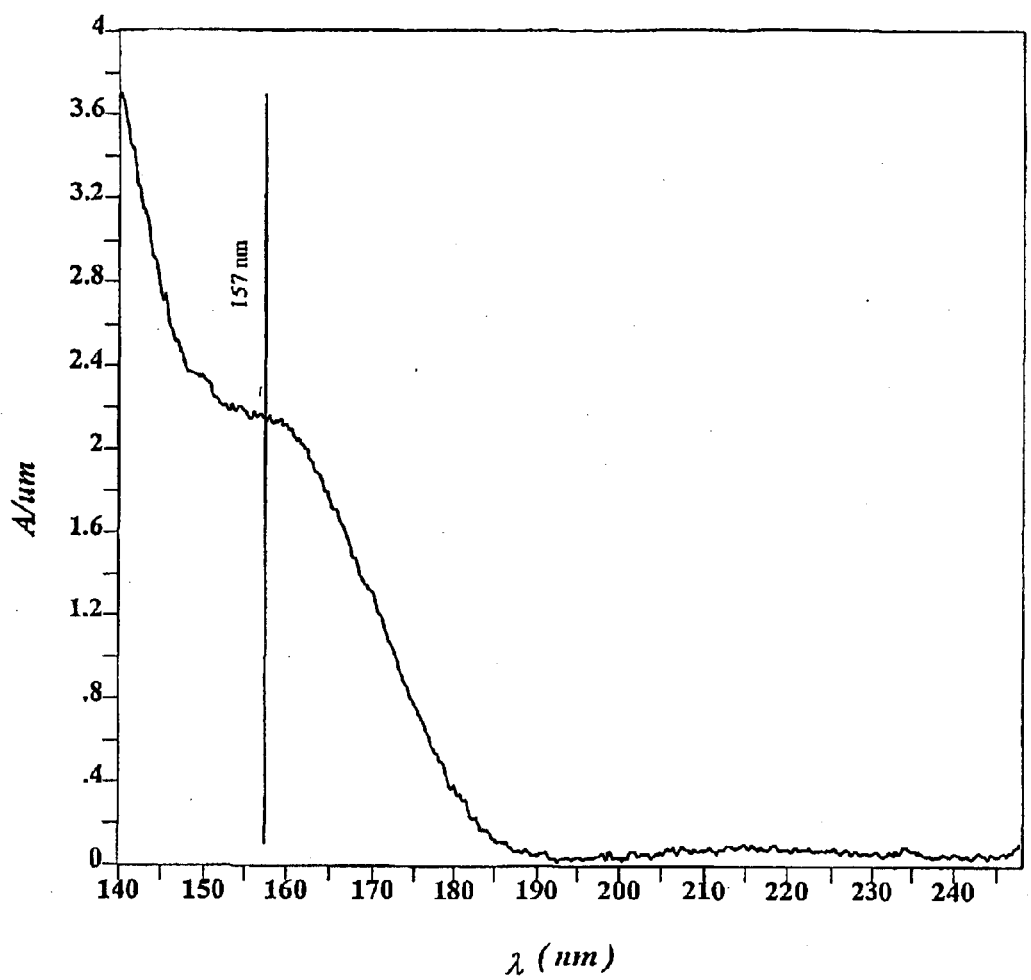
FIG. 7 is a plot of the optical absorbance per micron in units of inverse microns for P(HFIB/VAc/tBA) (copolymer of Example 5) versus wavelength lambda (λ) in units of nanometers.

The optical absorbance per micron in units of inverse microns for P(HFIB/VAc/tBA) (0.46/0.27/0.27) versus wavelength lambda (λ) in units of nanometers is shown in FIG. 7. The optical absorbance per micron at 157 nm determined from the copolymer film is 2.16/micron. The optical absorbance per micron at 193 nm determined from the copolymer film is 0.03/micron.

Image Generation/Lithographic Evaluation

The following solution was prepared and magnetically stirred overnight at ambient temperature.

| Component | Wt. (gm) |
| --- | --- |
| HFIB/VAc/tBA copolymer (0.46/0.27/0.27) as described in this example. | 0.294 |
| Cyclohexanone | 2.586. |
| 5% (wt) solution of triphenylsulfonium triflate dissolved in cyclohexanone which had been filtered through a 0.45μ PTFE syringe filter. | 0.120 |

This solution was subjected to the image generation/lithographic evaluation procedure as described in Example 1. A positive image was produced on the wafer with a clearing dose of approximately 21 mJ/cm².

EXAMPLE 6

Poly(Hexafluoroisobutylene/t-Butylacrylate) (41/59)

Copolymer Synthesis

A 75 ml stainless steel autoclave was loaded with 7.3 ml of t-butylacrylate (tBA). After chilling to less than −20° C., 20 ml of about 0.18 M DP in Vertrel™ XF were added. The autoclave was sealed, chilled, evacuated, and 33 g of hexafluoroisobutylene was added. The reaction mixture was shaken overnight (about 21 hours) at ambient temperature, reaching a peak of 11 psi (76 kPa) at 21.7° C. The fluid reaction mixture was evaporated to dryness, put under pump vacuum for a week, and dried for 7 hours in a 65–90° C. vacuum oven. This gave 9.8 g of solid, which was characterized as indicated below.

Calc. $(HFIB)_{0.41}(tBA)_{0.59}$: 48.44C; 5.56H

Found: 48.59C; 5.65H

Carbon-13 NMR analysis indicated 37.5 mole % of hexafluoroisobutylene and 62.5 mole % of t-butyl acrylate.

Image Generation/Lithographic Evaluation

The following solution was prepared and magnetically stirred overnight at ambient temperature.

| Component | Wt. (gm) |
| --- | --- |
| HFIB/tBA copolymer (0.41/0.59) as described in this example. | 0.234 |
| Cyclohexanone | 2.586. |
| t-Butyl Lithocholate | 0.060 |
| 5% (wt) solution of triphenylsulfonium triflate dissolved in cyclohexanone which had been filtered through a 0.45μ PTFE syringe filter. | 0.120 |

This solution was subjected to the image generation/lithographic evaluation procedure as described in Example 1. A positive image was produced on the wafer with a clearing dose of approximately 14.6 mJ/cm².

EXAMPLE 7

Poly(Hexafluoroisobutylene/Vinylidene Fluoride/t-Butyacrylate) (0.18/0.18/0.64)

Copolymer Synthesis

A 240 ml stainless steel autoclave was loaded with 15 ml Vertrel™ XF and 14 ml of t-butylacrylate (tBA). After chilling to less than −20° C., 20 ml of about 0.16 M DP in Vertrel™ XF were added. The autoclave was sealed, chilled, evacuated, and 32 g of hexafluoroisobutylene and 8 g of vinylidene fluoride added. The reaction mixture was shaken overnight (about 20 hours) at ambient temperature, reaching a peak of 74 psi (510 kPa) at 31.7° C. The fluid reaction mixture was evaporated to dryness, put under pump vacuum for 26 hours, and dried for 30 hours in a 75° C. vacuum oven. This gave 10 g of glassy solid, which was characterized as indicated below.

Calc. $(HFIB)_{0.18}(VF2)_{0.18}(tBA)_{0.64}$: 54.14C; 7.02H

Found: 54.13C; 6.94H

Optical Absorbance Per Micron Determination

Solutions of P(HFIB/VF2/tBA) (0.18/0.18/0.64) were spin coated from 1,2-bis(1,1,2,2-tetrafluoroethoxy)ethane at spin speeds of 6000 rpm onto $CaF_2$ substrates to produce copolymer films of 1584 angstroms thickness. VUV absorbance measurements were then used to determine the optical absorbance per micron.

Figure 8:
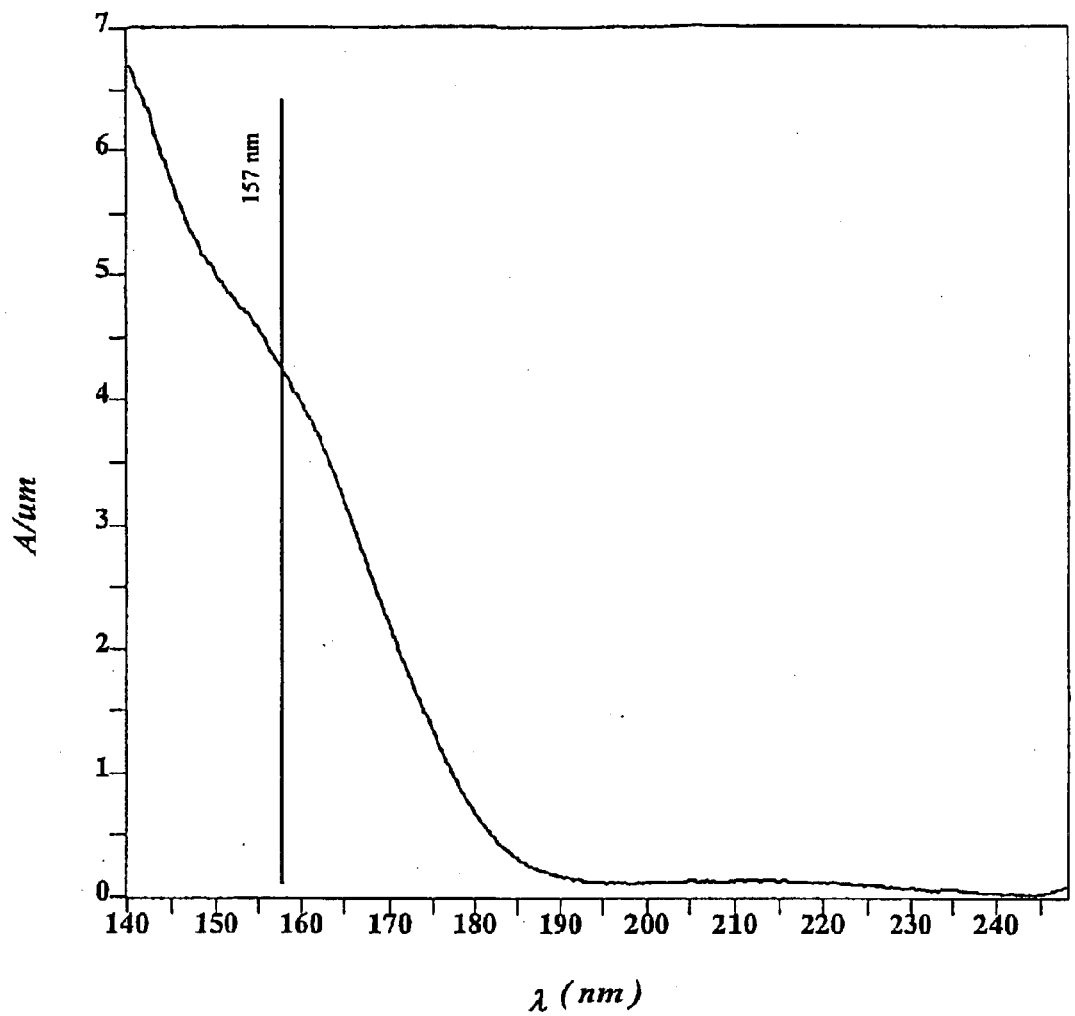
FIG. 8 is a plot of the optical absorbance per micron in units of inverse microns for P(HFIB/VF2/tBA) (copolymer of Example 7) versus wavelength lambda (λ) in units of nanometers.

The optical absorbance per micron in units of inverse microns for P(HFIB/VF2/tBA) (0.18/0.18/0.64) versus wavelength lambda (λ) in units of nanometers is shown in FIG. 8. The optical absorbance per micron at 157 nm determined from this copolymer film is 4.33/micron. The optical absorbance per micron at 193 nm determined from this copolymer film is 0.13/micron.

EXAMPLE 8

Poly(Hexafluoroisobutylene/Vinylidene Fluoride/t-Butylmethacrylate) (0.27/0.27/0.46)

Copolymer Synthesis

A 210 ml autoclave was loaded with 15 ml of Vertrel™ XF and chilled to less than −20° C. The autoclave was further loaded with 5.7 ml of t-butylmethacrylate and 20 ml of about 0.17 M HFPO DP in Vertrel™ XF. The autoclave was sealed, chilled, evacuated, and loaded with 32 g of hexafluoroisobutylene and 8 g of vinylidene fluoride. The reaction mixture was shaken overnight at ambient temperature (about 20 hours) reaching a peak of 61 psi (421 kPa) at 23° C. The fluid reaction mixture was evaporated to dryness and then put under pump vacuum for 1 week giving 7.9 g of product. An elemental analysis sample dried a further 19 hours in a 50° C. vacuum oven gave the following results, Calc. $(HFIB)_{0.27}(VF2)_{0.27}(tBMA)_{0.46}$: 49.93C; 5.92H Found: 49.74C; 6.02H Optical Absorbance Per Micron Determination of Base Resin Solutions of P(HFIB/VF2/tBMA) (0.27/0.27/0.46) in $HCF_2CF_2OCH_2CH_2OCF_2CF_2H$ solvent were spin coated from 1,2-bis(1,1,2,2-tetrafluoroethoxy)ethane at spin speeds of 6000 rpm onto $CaF_2$ substrates to produce copolymer films of 7930 angstroms thickness. VUV absorbance measurements were then used to determine the optical absorbance per micron.

Figure 9:
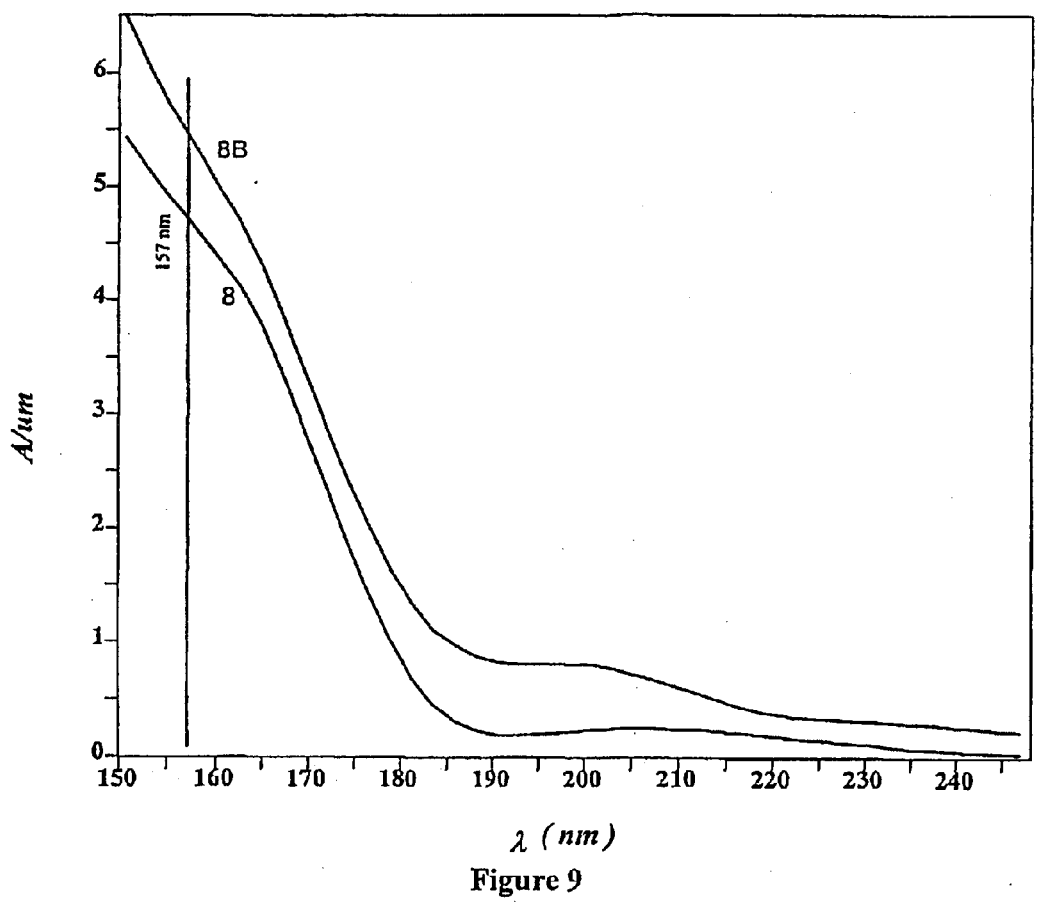
FIG. 9 is a plot of the optical absorbance per micron in units of inverse microns for P(HFIB/VF2/tBMA) (copolymer of Example 8) and a formulated photoresist (8B of Example 8) of P(HFIB:VF2:tBMA) versus wavelength lambda (λ) in units of nanometers.

The optical absorbance per micron in units of inverse microns for P(HFIB/VF2/tBMA) (0.27/0.27/0.46) versus wavelength lambda (λ) in units of nanometers is shown as spectrum 8 in FIG. 9 The optical absorbance per micron at 157 nm determined from the copolymer film is 4.69/micron. The optical absorbance per micron at 193 nm determined from the copolymer film is 0.20/micron.

Image Generation/Lithographic Evaluation Resist 8A

The following solution (formulated resist 8A) was prepared and magnetically stirred overnight at ambient temperature.

| Component | Wt. (gm) |
|---|---|
| HFIB/VF2/tBMA copolymer (0.27/0.27/0.46) as described in this example. | 0.290 |
| Solvent: $HCF_2CF_2OCH_2CH_2OCF_2CF_2H$ | 2.561 |
| 6.82% (wt) solution of triphenylsulfonium nonaflate dissolved in $HCF_2CF_2OCH_2CH_2OCF_2CF_2H$ which had been filtered through a 0.45μ PTFE syringe filter. | 0.150 |

This solution was subjected to the image generation/lithographic evaluation procedure as described in Example 1. A positive image was produced on the wafer with a clearing dose of approximately 7.6 mJ/cm².

Image Generation/Lithographic Evaluation For Resist 8B

The following solution (formulated resist 8B) was prepared and magnetically stirred overnight at ambient temperature.

| Component | Wt. (gm) |
|---|---|
| HFIB/VF2/tBMA copolymer (0.27/0.27/0.46) as described in this example. | 0.245 |
| Solvent: 65/35 (wt.) $HCF_2CF_2OCH_2CH_2OCF_2CF_2H$// 2-heptanone | 2.561 |
| t-butyl lithocholate | 0.045 |
| 6.82% (wt) solution of triphenylsulfonium nonaflate dissolved in 65/35 (wt.) $HCF_2CF_2OCH_2CH_2OCF_2CF_2H$/ 2-heptanone which had been filtered through a 0.45μ PTFE syringe filter. | 0.150 |

This solution was subjected to the image generation/lithographic evaluation procedure as described in Example 1. A positive image was produced on the wafer with a clearing dose of approximately 3.4 mJ/cm².

Optical Absorbance Per Micron Determination of Copolymer Film of Formulated Resist 8B The solution used for image generation/lithographic evaluation was spin coated from 1,2-bis(1,1,2,2-tetrafluoroethoxy)ethane at a spin speed of 2000 rpm onto $CaF2$ substrates to produce copolymer films of 1108 angstroms thickness. VUV absorbance measurements were then used to determine the optical absorbance per micron.

The optical absorbance per micron in units of inverse microns for copolymer film produced from this formulated resist versus wavelength lambda (λ) in units of nanometers is shown as spectrum 8B in FIG. 9. The optical absorbance per micron at 157 nm determined from the copolymer film is 5.37/micron. The optical absorbance per micron at 193 nm determined from the copolymer film is 0.83/micron.

EXAMPLE 9

Poly(Hexafluoroisobutylene/Vinylidene Fluoride/t-Butylmethacrylate) (0.23/0.26/0.51)

Copolymer Synthesis

A 400 ml autoclave was loaded with 30 ml of Vertrel™ XF and chilled to less than −20° C. The autoclave was further loaded with 17 ml of t-butylmethacrylate and 60 ml of about 0.17 M HFPO DP in Vertrel™ XF. The autoclave was sealed, chilled, evacuated, and loaded with 96 g of hexafluoroisobutylene and 24 g of vinylidene fluoride. The reaction mixture was shaken overnight at ambient temperature (about 17 hours) reaching a peak of 114 psi (786 kPa) at 30° C. The fluid reaction mixture was evaporated to dryness and then further dried for 10 days under pump vacuum and for 22 hours in a 75° C. vacuum oven giving 19 g of product. Elemental analysis found, Calc. $(HFIB)_{0.23}(VF2)_{0.26}(tBMA)_{0.51}$: 52.30C; 6.46H Found: 52.33C; 6.37H Optical Absorbance Per Micron Determination of Base Resin Solutions of P(HFIB/VF2/tBMA) (0.23/0.26/0.51) in $HCF_2CF_2OCH_2CH_2OCF_2CF_2H$ solvent were spin coated from 1,2-bis(1,1,2,2-tetrafluoroethoxy)ethane at spin speeds of 2000 rpm onto $CaF_2$ substrates to produce copolymer films of 10003 angstroms thickness. VUV absorbance measurements were then used to determine the optical absorbance per micron.

Figure 10:
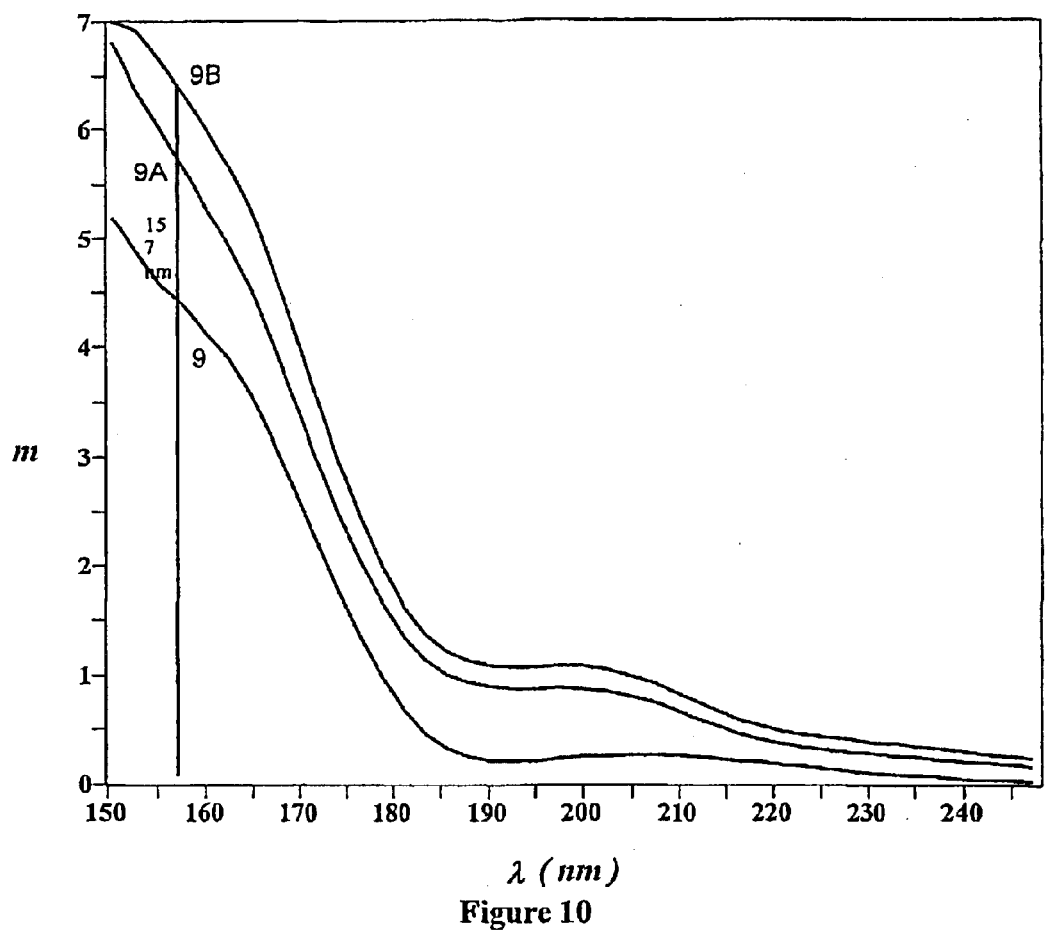
FIG. 10 is a plot of the optical absorbance per micron in units of inverse microns for P(HFIB/VF2/tBMA)

The optical absorbance per micron in units of inverse microns for P(HFIB/VF2/tBMA) (0.23/0.26/0.51) versus wavelength lambda ($\lambda$) in units of nanometers is shown as spectrum 9 in FIG. 10. The optical absorbance per micron at 157 nm determined from the copolymer film is 4.40/micron. The optical absorbance per micron at 193 nm determined from the copolymer film is 0.22/micron.

Image Generation/Lithographic Evaluation For Resist 9A

The following solution (formulated resist 9A) was prepared and magnetically stirred overnight at ambient temperature.

| Component | Wt. (gm) |
|---|---|
| HFIB/VF$_2$/tBMA copolymer (0.23/0.26/0.51) as described in this example. | 0.290 |
| Solvent: HCF$_2$CF$_2$OCH$_2$CH$_2$OCF$_2$CF$_2$H | 2.561 |
| 6.82% (wt) solution of triphenylsulfonium nonaflate dissolved in HCF$_2$CF$_2$OCH$_2$CH$_2$OCF$_2$CF$_2$H which had been filtered through a 0.45$\mu$ PTFE syringe filter. | 0.150 |

This solution was subjected to the image generation/lithographic evaluation procedure as described in Example 1. A positive image was produced on the wafer with a clearing dose of approximately 4.3 mJ/cm$^2$.

Optical Absorbance Per Micron Determination of Copolymer Film of Formulated Resist 9A The solution used for image generation/lithographic evaluation was spin coated from 1,2-bis(1,1,2,2-tetrafluoroethoxy)ethane at a spin speed of 6000 rpm onto CaF2 substrates to produce copolymer films of 2284 angstroms thickness. VUV absorbance measurements were then used to determine the optical absorbance per micron.

The optical absorbance per micron in units of inverse microns for copolymer film produced from this formulated resist versus wavelength lambda ($\lambda$) in units of nanometers is shown as spectrum 9A in FIG. 10. The optical absorbance per micron at 157 nm determined from the copolymer film is 5.71/micron. The optical absorbance per micron at 193 nm determined from the copolymer film is 0.88/micron.

Image Generation/Lithographic Evaluation For Resist 9B

The following solution (formulated resist 9B) was prepared and magnetically stirred overnight at ambient temperature.

| Component | Wt. (gm) |
|---|---|
| HFIB/VF$_2$/tBMA copolymer (0.23/0.26/0.51) as described in this example. | 0.245 |
| Solvent: 65/35 (wt.) HCF$_2$CF$_2$OCH$_2$CH$_2$OCF$_2$CF$_2$H// 2-heptanone | 2.561 |
| t-butyl lithocholate | 0.045 |
| 6.82% (wt) solution of triphenylsulfonium nonaflate dissolved in 65/35 (wt.) HCF$_2$CF$_2$OCH$_2$CH$_2$OCF$_2$CF$_2$H/ 2-heptanone which had been filtered through a 0.45 $\mu$ PTFE syringe filter. | 0.150 |

This solution was subjected to the image generation/lithographic evaluation procedure as described in Example 1. A positive image was produced on the wafer with a clearing dose of approximately 5.6 mJ/cm$^2$.

Optical Absorbance Per Micron Determination of Copolymer Film of Formulated Resist 9B The solution used for image generation/lithographic evaluation was spin coated from 1,2-bis(1,1,2,2-tetrafluoroethoxy)ethane at a spin speed of 6000 rpm onto CaF2 substrates to produce copolymer films of 1188 angstroms thickness. VUV absorbance measurements were then used to determine the optical absorbance per micron.

The optical absorbance per micron in units of inverse microns for copolymer film produced from this formulated resist versus wavelength lambda ($\lambda$) in units of nanometers is shown as spectrum 9B in FIG. 10. The optical absorbance per micron at 157 nm determined from the copolymer film is 6.43/micron. The optical absorbance per micron at 193 nm determined from the copolymer film is 1.08/micron.

EXAMPLE 10

Poly(Hexafluoroisobutylene/t-Butylacrylate) (0.44/0.56)

Copolymer Synthesis

An autoclave was chilled to less than $-20°$ C. and loaded with 20 ml of about 0.17 M HFPO DP in Vertrel™ XF and 7.3 ml of t-butylacrylate. The autoclave was sealed, chilled, evacuated, and loaded with 100 g of hexafluoroisobutylene. The reaction mixture was shaken overnight at ambient temperature (about 18 hours) reaching a peak of 10 psi (69 kPa) at 24° C. The fluid reaction mixture was evaporated to dryness and then further dried for 5 days under pump vacuum and for 2 to 3 days in a 50° C. vacuum oven giving 7 g of product. Elemental analysis found, Calc. (HFIB)$_{0.44}$(tBA)$_{0.56}$: 47.23C; 5.28H Found: 47.15C; 5.06H Optical Absorbance Per Micron Determination of Base Resin Solutions of P(HFIB/tBA) (0.44/0.56) in HCF$_2$CF$_2$OCH$_2$CH$_2$OCF$_2$CF$_2$H solvent were spin coated at spin speeds of 2000 rpm onto CaF$_2$ substrates to produce copolymer films of 9510 angstroms thickness. VUV absorbance measurements were then used to determine the optical absorbance per micron.

The optical absorbance per micron in units of inverse microns for P(HFIB/tBA) (0.44/0.56) versus wavelength lambda ($\lambda$) in units of nanometers is shown as spectrum 10 in FIG. 11. The optical absorbance per micron at 157 nm determined from the copolymer film is 3.74/micron. The optical absorbance per micron at 193 nm determined from the copolymer film is 0.12/micron.

Image Generation/Lithographic Evaluation For Resist 10A

The following solution (formulated resist 10A) was prepared and magnetically stirred overnight at ambient temperature.

| Component | Wt. (gm) |
|---|---|
| HFIB/tBA copolymer (0.44/0.56) as described in this example. | 0.290 |

-continued

| Component | Wt. (gm) |
|---|---|
| Solvent: 65/35 (wt.) $HCF_2CF_2OCH_2CH_2OCF_2CF_2H$// 2-heptanone | 2.561 |
| 6.82% (wt) solution of triphenylsulfonium triflate dissolved in $HCF_2CF_2OCH_2CH_2OCF_2CF_2H$ which had been filtered through a 0.45 µ PTFE syringe filter. | 0.150 |

This solution was subjected to the image generation/lithographic evaluation procedure as described in Example 1. A positive image was produced on the wafer with a clearing dose of approximately 4.3 mJ/cm$^2$.

Image Generation/Lithographic Evaluation For Resist 10B

The following solution (formulated resist 10B) was prepared and magnetically stirred overnight at ambient temperature.

| Component | Wt. (gm) |
|---|---|
| HFIB/tBA copolymer (0.44/0.56) as described in this example. | 0.245 |
| Solvent: $HCF_2CF_2OCH_2CH_2OCF_2CF_2H$ | 2.561 |
| 6.82% (wt) solution of triphenylsulfonium triflate dissolved in 65/35 (wt.) $HCF_2CF_2OCH_2CH_2OCF_2CF_2H$/ 2-heptanone which had been filtered through a 0.45 µ PTFE syringe filter. | 0.150 |

This solution was subjected to the image generation/lithographic evaluation procedure as described in Example 1. A positive image was produced on the wafer with a clearing dose of approximately 4.3 mJ/cm$^2$.

Optical Absorbance Per Micron Determination of Copolymer Film of Formulated Resist 10B The solution used for image generation/lithographic evaluation was spin coated at a spin speed of 6000 rpm onto CaF2 substrates to produce copolymer films of 1160 angstroms thickness. VUV absorbance measurements were then used to determine the optical absorbance per micron.

The optical absorbance per micron in units of inverse microns for copolymer film produced from this formulated resist versus wavelength lambda (λ) in units of nanometers is shown as spectrum 10B in FIG. 11. The optical absorbance per micron at 157 nm determined from the copolymer film is 5.43/micron. The optical absorbance per micron at 193 nm determined from the copolymer film is 0.81/micron.

EXAMPLE 11 (PROPHETIC)

This example illustrates that the compound having the structure of $HCF_2CF_2OCH_2CH_2OCF_2CF_2H$ is significantly better as a spreading solvent on silicon in relation to standard solvents (e.g., 2-heptanone).

Solutions are made by dissolving 0.1 g of P(HFIB/VF2/tBMA) (0.23/0.26/0.51) from Example 9 in 1 gram of 2-heptanone and 0.1 g of P(HFIB/VF2/tBMA) (0.23/0.26/0.51) from Example 9 in 1 gram of $HCF_2CF_2OCH_2CH_2OCF_2CF_2H$. Both solutions are spotted on silicon wafers and allowed to air dry. As the solution in 2-heptanone dries, the liquid pool beads up eventually leaving a thick deposit of copolymer about 0.25" in diameter and scattered thin patches copolymer where the solution has drawn back from the wafer surface. In contrast the solution in $HCF_2CF_2OCH_2CH_2OCF_2CF_2H$ dries down to a smooth copolymer film roughly the diameter of the starting liquid pool. Paralleling this better wetting for copolymer in $HCF_2CF_2OCH_2CH_2OCF_2CF_2H$ solvent, the solution in $HCF_2CF_2OCH_2CH_2OCF_2CF_2H$ spin coats to a more attractive and uniform film than the same copolymer in 2-heptanone solvent.

What is claimed is:

1. A photoresist comprising a copolymer comprising:
   (a) a first repeat unit derived from at least one fluoroolefin having the structure

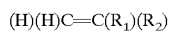
   (H)(H)C=C(R$_1$)(R$_2$)

wherein R$_1$ and R$_2$ are independently selected from the group consisting of C$_1$–C$_3$ perfluoroalkyl, or taken together are (CF$_2$)$_n$ wherein n is 3 to 5; and
   (b) a second repeat unit derived from a first ethylenically unsaturated comonomer comprising an acid group or a protected acid group.

2. The photoresist of claim 1 wherein the copolymer has an absorption coefficient of less than 5.0 □m$^{-1}$ at a wavelength of 157 nm.

3. The photoresist of claim 1 which is a positive-working photoresist.

4. The photoresist of claim 1 wherein the photoactive component is a photoacid generator.

5. The photoresist of claim 1 further comprising a solvent selected from the group consisting of cyclohexanone, 2-heptanone, and $HCF_2CF_2OCH_2CH_2OCF_2CF_2H$.

6. The photoresist of claim 5 further comprising a cosolvent which facilitates the film forming capabilities of a photoresist formulation in which the cosolvent is $HCF_2CF_2OCH_2CH_2OCF_2CF_2H$.

7. The photoresist of claim 1 in which the solvent is 2-heptanone and the cosolvent is $HCF_2CF_2OCH_2CH_2OCF_2CF_2H$.

8. A process for preparing a photoresist image on a substrate comprising, in order:
   (A) applying a photoresist composition on a substrate to form a photoresist layer, wherein the photoresist composition comprises:
      (1) a copolymer comprising:
         (a) a first repeat unit derived from at least one fluoroolefin having the structure:

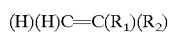
         (H)(H)C=C(R$_1$)(R$_2$)

wherein R$_1$ and R$_2$ are independently selected from the group consisting of C$_1$–C$_3$ perfluoroalkyl, or taken together are (CF$_2$)$_n$ wherein n is 3 to 5; and
         (b) a second repeat unit derived from a first ethylenically unsaturated comonomer comprising an acid group or a protected acid group; and
      (2) at least one photoactive component;
   (B) imagewise exposing the photoresist layer to form imaged and non-imaged areas; and
   (C) developing the exposed photoresist layer having imaged and non-imaged areas to form the photoresist image on the substrate.

9. The process of claim 8 further comprising, between steps (A) and (B), a step of drying the photoresist composition to substantially remove solvent and thereby form the photoresist layer on the substrate, wherein the photoresist composition is further comprised of a solvent.

10. The photoresist of claim 1 wherein the second repeat unit is a tertiary-alkyl acrylate or a tertiary-alkyl methacrylate in which the alky group ranges from four to about ten carbon atoms and the first repeat unit is hexafluoroisobutylene or decafluoroisohexylene.

11. The photoresist of claim 10 wherein the first repeat unit is hexafluoroisobutylene and the second repeat unit is the tertiary-alkyl acrylate.

12. The photoresist of claim 1 further comprising a third repeat unit derived from a second ethylenically unsaturated comonomer, wherein the third repeat unit is derived from vinyl fluoride, vinylidene fluoride, vinyl acetate, trifluoroethylene, tetrafluoroethylene, 4,5-difluoro-2,2-bis(trifluoromethyl)-1,3-dioxole, 2,2-bis(trifluoromethyl)-1,3-dioxole, vinyl alcohol, 1,3-dioxole-2-one, or maleic anhydride.

13. The photoresist of claim 1 in which the copolymer further comprises an aliphatic polycyclic functionality, wherein the percentage of repeat units of the copolymer containing aliphatic polycyclic functionality ranges from about 1 to about 50 mole percent.

14. The photoresist of claim 1 further comprising at least one member selected from the group consisting of a carboxylic acid, a fluoroalcohol, and a protected fluoroalcohol.

* * * * *

UNITED STATES PATENT AND TRADEMARK OFFICE
CERTIFICATE OF CORRECTION

PATENT NO.        : 6,872,503 B2
APPLICATION NO.   : 10/257901
DATED             : March 29, 2005
INVENTOR(S)       : Robert Clayton Wheland et al.

It is certified that error appears in the above-identified patent and that said Letters Patent is hereby corrected as shown below:

Col. 30
Claim 2, line 25:   "An absorption coefficient of less than 5.0☐m$^{-1}$ at a wave-" should read --an absorption coefficient of less than 5.0 μm$^{-1}$ at a wave--.

Col. 31
Claim 11, line 12:  "the tertiary-alkyl acrylate." should read --tertiary-alkyl acrylate.--

Signed and Sealed this

Fifth Day of September, 2006

JON W. DUDAS
*Director of the United States Patent and Trademark Office*